United States Patent
Nishimura et al.

(10) Patent No.: US 7,227,822 B2
(45) Date of Patent: Jun. 5, 2007

(54) LASER DRIVER AND OPTICAL DISK SYSTEM

(75) Inventors: Koichiro Nishimura, Ebina (JP); Manabu Katsuki, Yokohama (JP); Toshimitsu Kaku, Sagamihara (JP)

(73) Assignees: Hitachi, Ltd., Tokyo (JP); Hitachi-LG Storage, Inc., Tokyo (JP)

( * ) Notice: Subject to any disclaimer, the term of this patent is extended or adjusted under 35 U.S.C. 154(b) by 538 days.

(21) Appl. No.: 10/782,330

(22) Filed: Feb. 18, 2004

(65) Prior Publication Data
US 2004/0233814 A1 Nov. 25, 2004

(30) Foreign Application Priority Data
May 22, 2003 (JP) ............... 2003-144257

(51) Int. Cl.
*G11B 7/00* (2006.01)
(52) U.S. Cl. ............... 369/47.5; 369/116; 369/47.28; 369/59.12; 369/59.11
(58) Field of Classification Search ............... 369/47.5, 369/47.51, 47.52, 47.28, 59.12, 59.11
See application file for complete search history.

(56) References Cited

U.S. PATENT DOCUMENTS 6,538,966 B1 * 3/2003 Hanks ............... 369/47.28

FOREIGN PATENT DOCUMENTS

JP 11-283249 10/1999

* cited by examiner

*Primary Examiner*—Nabil Hindi
(74) *Attorney, Agent, or Firm*—Townsend and Townsend and Crew LLP

(57) ABSTRACT

A laser driver drives a laser diode by producing a write strategy, that is, a recording waveform from a recording clock and a modulated signal. In one embodiment, a laser driver produces the waveform of a driving signal, which is used to drive a laser diode, using a record data signal that represents record data to be recorded on a recording medium. The laser driver comprises an internal clock production circuit that produces an internal clock synchronous with the record data signal, and a strobe circuit that strobes the record data signal according to the internal clock.

8 Claims, 25 Drawing Sheets

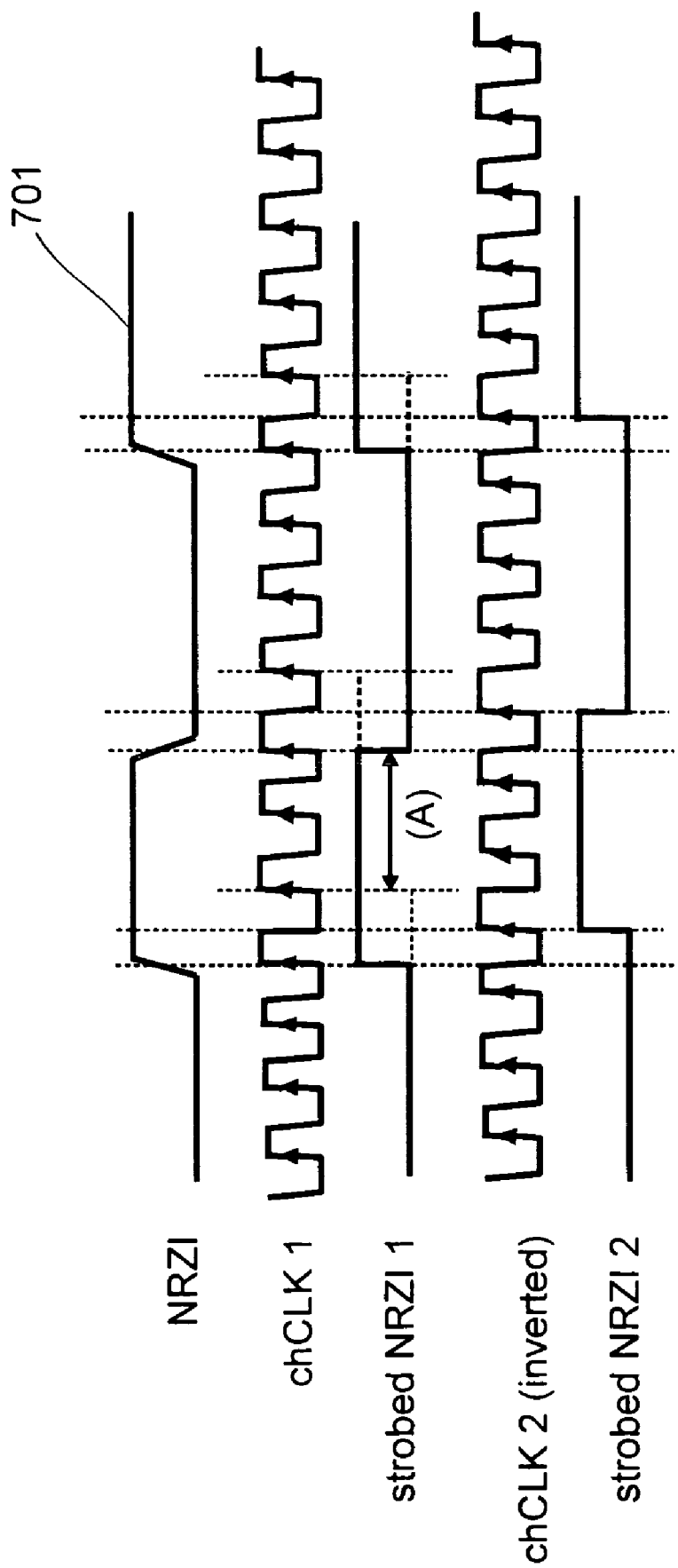

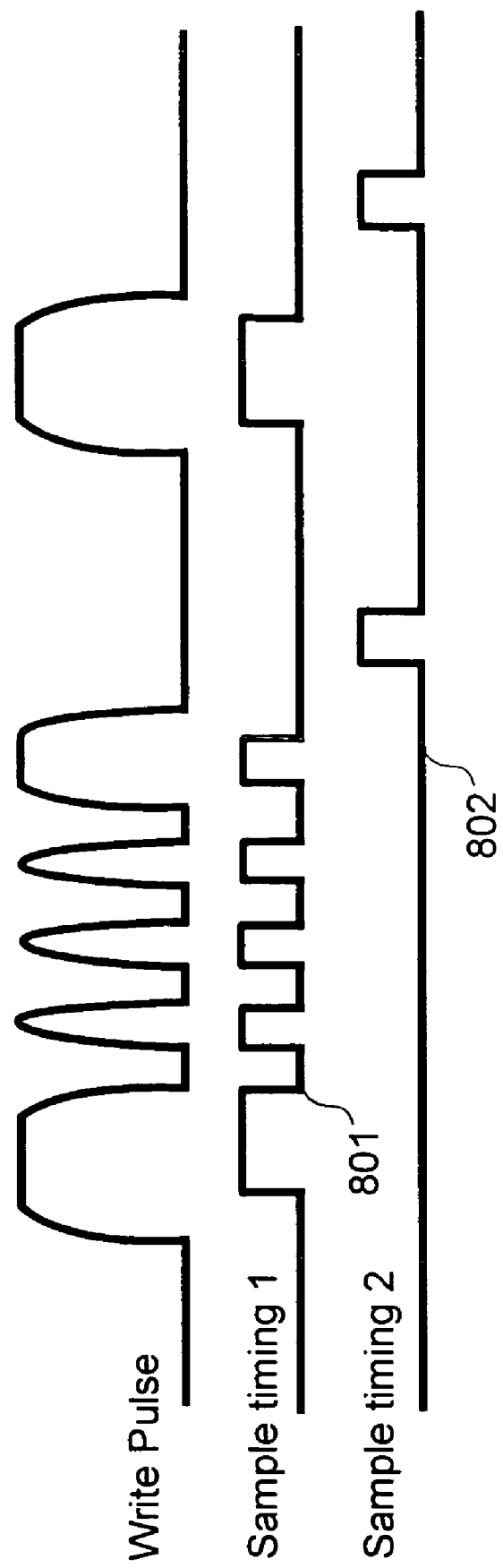

LASER DRIVER AND OPTICAL DISK SYSTEM

CROSS-REFERENCES TO RELATED APPLICATIONS

This application relates to and claims priority from Japanese Patent Application No. 2003-144257, filed on May 22, 2003, the entire disclosure of which is incorporated herein by reference.

BACKGROUND OF THE INVENTION

1. Field of the Invention

The present invention relates generally to recording devices and, more particularly, to a laser driver that produces a write strategy using a binary record signal which is recorded on a recording medium and a record, and an optical disk system in which data can be recorded and which includes the laser driver.

2. Description of the Related Art

In recent years, a recording speed at which data is recorded on an optical disk has improved. When modulated data is recorded on the optical disk at a high speed, a laser control signal must be transmitted to a laser driver in order to realize a write strategy, that is, a recording waveform inferred from the record data. Techniques for transmitting the control signal include a technique of transmitting a record data signal resulting from modulation of data, for example, a non-return-to-zero inversion (NRZI) signal, and a recording clock to the laser driver. Consequently, a write strategy is produced based on the received NRZI signal and recording clock within the laser driver (refer to, for example, Japanese Unexamined Patent Application Publication No. 11-283249).

According to the technique, the laser driver produces the write strategy from the NRZI signal. Therefore, the laser driver must strobe the NRZI signal received from a digital signal processor (DSP) according to the recording clock so as to verify whether the NRZI signal assumes logical 0 or 1.

When the recording clock is used to strobe the NRZI signal, a setup time required until the logical state of the NRZI signal is finalized prior to strobing and a hold time required until data fetch is completed after the completion of the strobing must be preserved. Unless these times are preserved, strobed data cannot be finalized and a recording error may occur. For example, assume that the laser driver having the setup time set to 0.8 ns and the hold time set to 0.6 ns is used to record data on a DVD-R/RW disk in decoupled speed mode. In this case, since the time of one cycle of the recording clock is 3.8 ns, the phase of the NRZI signal relative to the recording clock must be controlled so that the edge of the NRZI signal will come during 2.4 ns calculated by subtracting the setup time and hold time from 3.8 ns.

Moreover, the phase of the NRZI signal relative to the recording clock is affected by a phase error caused by a modulating device, the property of a transmission line, a change in the properties of the laser driver depending on the internal temperature and supply voltage of a pickup head, and the jitters of the NRZI signal and recording clock. The phase of an NRZI signal relative to a clock must be controlled with a sufficient phase margin ensured.

Methods for avoiding the above problems include a method employing a variable delay circuit that can delay the NRZI signal and recording clock after or immediately before the NRZI signal and recording clock are transferred to the laser driver, and a circuit that can monitor the phase relationship between the NRZI signal and an internal strobing clock. According to the method, for example, a microcomputer that controls a system changes the magnitude of a delay to be produced by the variable delay circuit, and monitors a monitor signal. The microcomputer thus adjusts the magnitude of a delay to be produced by the variable delay circuit so that the phase relationship between the NRZI signal and recording clock will be optimized.

BRIEF SUMMARY OF THE INVENTION

The problems described below underlie the foregoing related art.

1. As mentioned above, the magnitude of a delay to be given to the NRZI signal and recording clock is changed in order to establish an optimal phase relationship. However, when the phase relationship between the NRZI signal and recording clock is changed during data recording, the possibility of a recording error arises. Therefore, when the power supply is turned on or when a disk is inserted, the phase relationship between the NRZI signal and recording clock must be learned. The learning delays an activation time instant and a disk recording start time instant.

2. As mentioned above, the phase relationship between the NRZI signal and recording clock is affected by the internal temperature or supply voltage of the pickup head or laser driver. Therefore, if the phase relationship is changed after the completion of the learning described in Paragraph 1, a strobing error may occur.

3. As mentioned above, if the magnitude of a delay given to the NRZI signal and recording clock by the variable delay circuit is smaller than the cycle of the recording clock, the optimal phase relationship between the NRZI signal and recording clock cannot be detected. A phase margin required to cope with a strobing error cannot be maximized. In this case, the possibility of the strobing error mentioned in Paragraph 2 increases.

Embodiments of the present invention overcome the foregoing problems. In one embodiment, a laser driver produces the waveform of a driving signal, which is used to drive a laser diode, using a record data signal that represents record data to be recorded on a recording medium. The laser driver comprises an internal clock production circuit that produces an internal clock synchronous with the record data signal, and a strobe circuit that strobes the record data signal according to the internal clock.

In another embodiment, a laser driver produces the waveform of a driving signal, which is used to drive a laser diode, using a record data signal that represents record data to be recorded on a recording medium and a recording clock. The laser driver comprises: a mark/space verification circuit that verifies according to the recording clock whether the record data represented by the record data signal is a mark or a space; and a recording clock inversion circuit that inverts the phase of the received recording clock. When the mark/space verification circuit detects a mark or space having a predetermined length or less, the recording clock inversion circuit inverts the phase of the recording clock.

In another embodiment, a laser driver produces the waveform of a driving signal, which is used to drive a laser diode, using a record data signal that represents record data to be recorded on a recording medium and a recording clock. The laser driver comprises: a phase-locked loop that produces an internal clock synchronous with the recording clock and a group of clocks including a plurality of clocks that are out of phase with the internal clock by predetermined magnitudes; a write strategy controller that controls the timing of an edge of a write strategy, that is, a recording waveform according to a setting designated outside the laser driver according to the timings of the edges of the group of clocks; a selector that selects a strobing clock, which is used to strobe the received record data signal, from the group of clocks. The selector selects a strobing clock, which is used to produce the write strategy, from the group of clocks on the basis of the results of strobing the record data signal according to the clocks included in the group of clocks so that the phase difference between the edge of the record data signal and the strobing edge, that is, the leading edge of the strobing clock, will be maximized.

BRIEF DESCRIPTION OF THE DRAWINGS

FIG. 7 shows waveforms indicating phase regulation to be performed according to the second embodiment of the present invention;

FIG. 8 shows waveforms indicating sample-and-hold to be performed according to the second embodiment of the present invention;

DETAILED DESCRIPTION OF THE INVENTION

Figure 1:
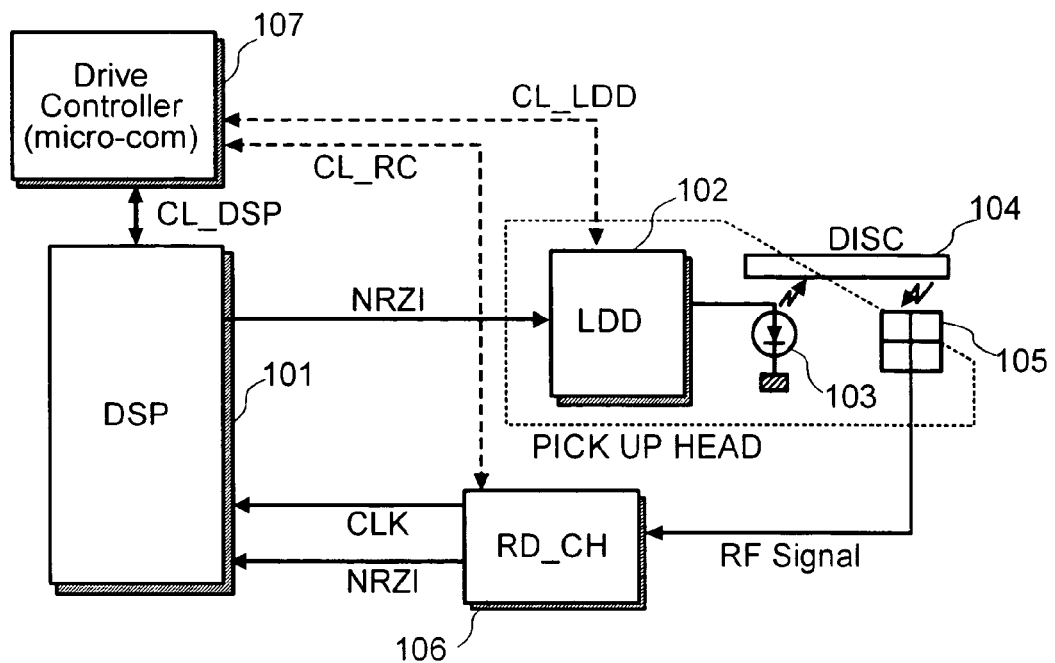
FIG. 1 shows the configuration of an optical disk system in accordance with a first embodiment of the present invention.

FIG. 1 shows the configuration of an optical disk system in accordance with a first embodiment of the present invention. In order to record data on a recording medium, data sent from a host personal computer or the like that is not shown is modulated into a record data signal (modulated in NRZI mode in the present embodiment) by a digital signal processor (DSP) 101. The NRZI signal is transmitted to a laser driver 102 over a cable that is not shown, such as, a flexible cable. The laser driver 102 produces a write strategy, that is, a recording waveform from the record data signal, drives a laser diode 103 according to the produced write strategy, and records record data on a recording medium 104.

In order to regenerate data from the recording medium, the laser driver 102 drives the laser diode 103. A photo-detector 105 receives light reflected from the recording medium 104. The photo-detector 105 photoelectrically converts the received laser light, and transmits the resultant regenerative radio-frequency signal to a reading channel circuit 106. The reading channel circuit 106 produces a regenerative data signal (in NRZI mode according to the present embodiment) and a regenerative clock CLK from the regenerative radio-frequency signal, and transmits them to the DSP 101. The DSP 101 demodulates data from the NRZI signal according to the clock CLK, and transmits the data to the host personal computer that is not shown.

Figure 2:
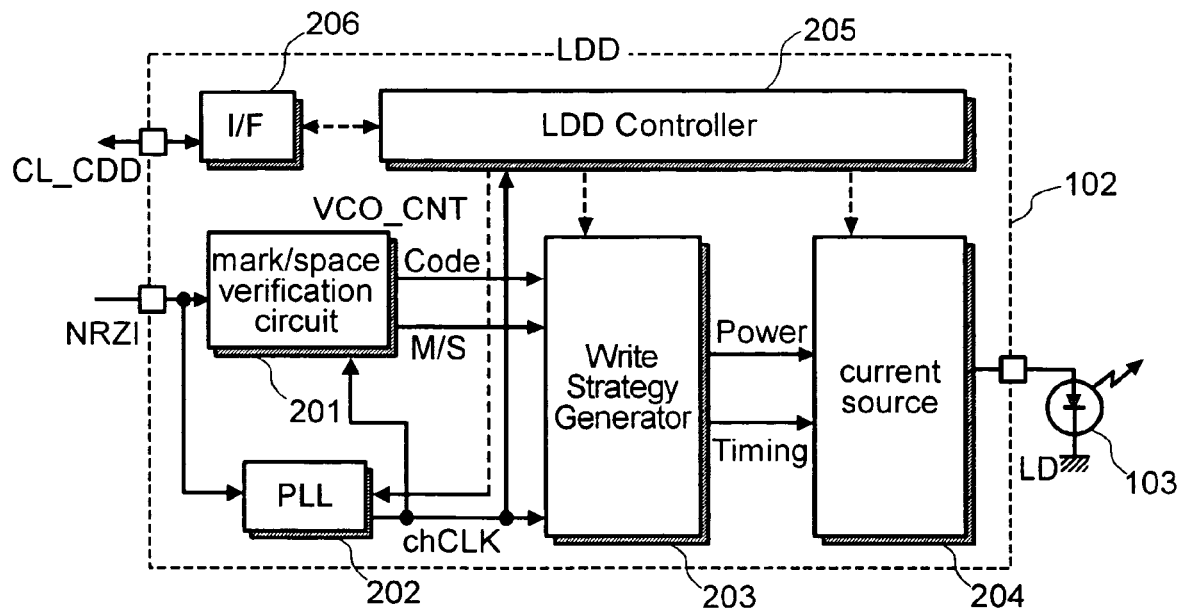
FIG. 2 shows the internal configuration of a laser driver in accordance with the first embodiment of the present invention.

FIG. 2 shows the internal configuration of the laser driver in accordance with the present embodiment. A mark/space verification circuit 201 produces mark/space information (M/S) and pulse duration information (Code) from the NRZI signal according to an internal clock chCLK that is synchronous with the NRZI signal and that is produced by a phase-locked loop (PLL) 202. The information is transmitted to a write strategy generator or recording waveform production block 203 in the next stage. The write strategy generator 203 produces information of a record pulse timing and record pulse power from the mark/space information, pulse duration information, and a strategy shift regulation value set by a laser driver controller 205. The information is transmitted to a current source 204 in the next stage. The current source 204 produces a record pulse from the information of the record pulse timing and record pulse power sent from a recording waveform production block 203. Consequently, the laser diode 103 is driven. The laser driver controller 205 controls these blocks. The laser driver controller 205 is controlled by a controller included in the optical disk system, or in the present embodiment, a microcomputer 107 via an interface 206.

Figure 3:
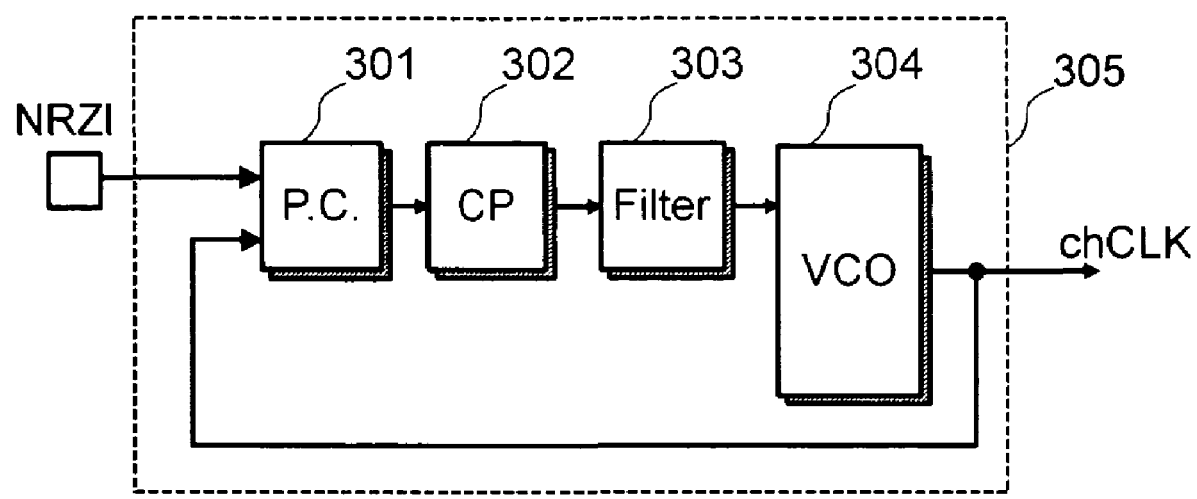
FIG. 3 shows the configuration of a phase-locked look included in the first embodiment of the present invention.

FIG. 3 shows the configuration of the PLL 202 included in the present embodiment. In this configuration of PLL 305, a charge pump circuit 302 smoothes a phase difference signal that represents the phase difference between the NRZI signal and an internal clock chCLK and is produced by a phase comparator 301. A filter 303 limits the bandwidth of the phase difference signal, and transfers the resultant signal to a voltage controlled oscillator (VCO) 304. The VCO 304 transmits as the internal clock chCLK a signal whose frequency is determined with a center frequency designated by the control block 205 included in the laser driver and a VCO control voltage transmitted from the filter 303.

Figure 4:
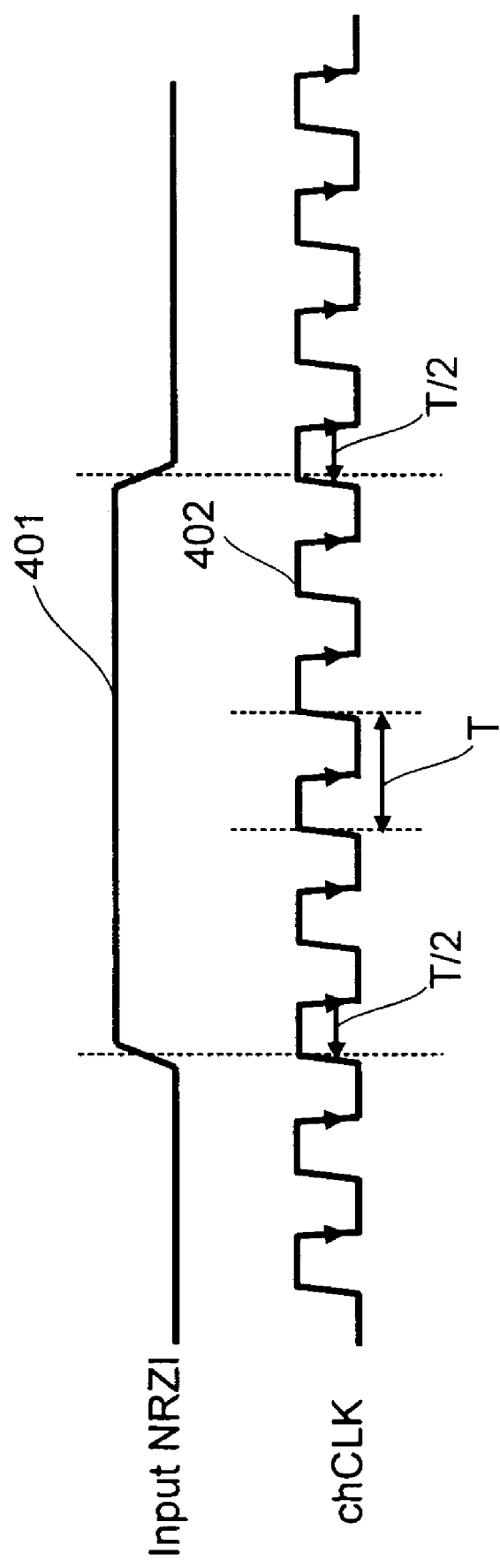
FIG. 4 shows waveforms indicating phase regulation to be performed according to the first embodiment of the present invention.

FIG. 4 shows waveforms indicating actions to be performed according to the present embodiment. The PLL 202 acts so that the leading edge of the NRZI signal 401 and the leading edge of the internal clock chCLK 402 will be synchronized with each other. At this time, if the NRZI signal is, as shown in FIG. 4, strobed at the trailing edge of the internal clock chCLK, a margin for a relative phase error between the NRZI signal and internal clock chCLK is maximized to T/2 (where T denotes the cycle of the internal clock chCLK).

The present embodiment provides the advantages described below.

1. A signal transmitted from the DSP 101 to the laser driver is the NRZI signal alone. Therefore, it is unnecessary to take account of the phase of the NRZI signal relative to the clock CLK at the output terminal of the DSP or on the transmission line linking the DSP and laser driver. Therefore, the phase margin required for strobing can be expanded.

2. Since transmission of the clock CLK that causes the frequency of the clock to increase need not be performed, the specification of a frequency characteristic of the transmission line can be alleviated. Moreover, occurrence of a noise can be prevented.

3. The number of lines between the DSP and laser driver can be reduced.

Figure 5:
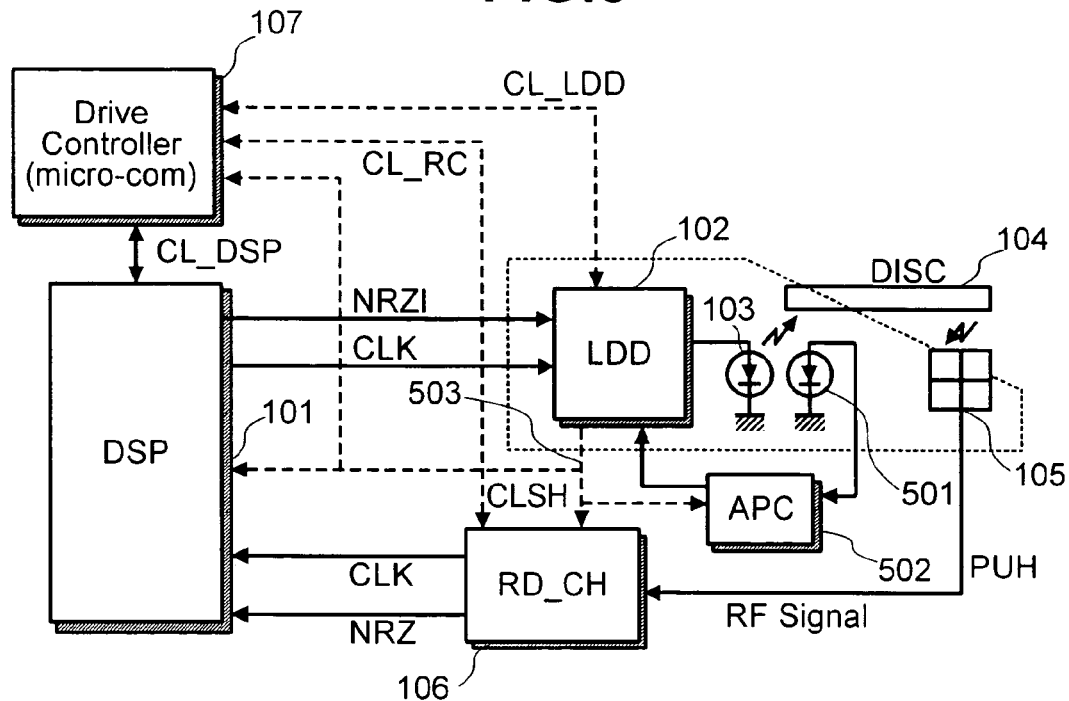
FIG. 5 shows the configuration of an optical disk system in accordance with a second embodiment of the present invention.

FIG. 5 shows the configuration of an optical disk system in accordance with a second embodiment of the present invention.

In FIG. 5, the same reference numerals are assigned to components having the same capabilities as those shown in FIG. 1. The description of the components will be omitted. A difference of FIG. 5 from FIG. 1 lies in that although a signal sent from the DSP 101 to the laser driver 102 over a flexible cable or the like is the NRZI signal in FIG. 1, both the NRZI signal and clock CLK are transmitted in FIG. 5. In FIG. 5, reference numeral 501 denotes a front monitor that photoelectrically converts a light wave emitted from the laser diode 103, and 502 denotes an auto power control (APC) circuit that retains the laser power at a predetermined value.

Moreover, the flow of a signal that is recorded on a recording medium or regenerated from the recording medium is identical to the one in the first embodiment of the present invention. The description will therefore be omitted.

Figure 6:
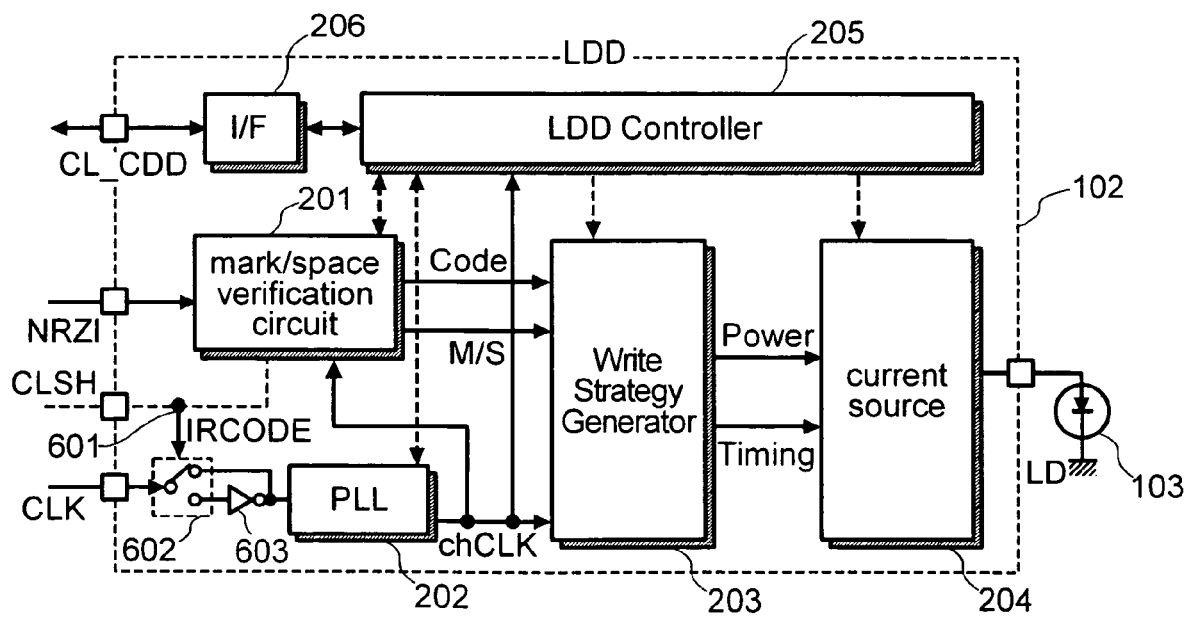
FIG. 6 shows the internal configuration of a laser driver in accordance with the second embodiment of the present invention.

FIG. 6 shows the internal configuration of the laser driver in accordance with the present embodiment. In the drawing, the same reference numerals are assigned to components having the same capabilities as those shown in FIG. 2. The description of the components will be omitted. In FIG. 6, reference numeral 602 denotes a switch, and 603 denotes an inverter that inverts the phase of the clock CLK.

FIG. 7 shows waveforms of signals transmitted from components included in the present embodiment. Phase control for the NRZI signal and clock CLK to be performed according to the present embodiment will be described in conjunction with FIG. 6 and FIG. 7. The NRZI signal having the waveform shown in FIG. 7 is strobed at the leading edge of the internal clock chCLK.

Assume that the phase of the internal clock chCLK relative to the NRZI signal corresponds to that of a clock chCLK1 having the waveform shown in FIG. 7. In other words, the timings of the leading and trailing edges of the NRZI signal agree with the timing of the leading edge of the clock chCLK1. In this case, if the phase relationship between the NRZI signal 701 and clock chCLK1 changes due to a change in the temperature or environment of the transmission line linking the DSP and laser driver or a variation of a line voltage, the result of strobing varies. Consequently, when the mark/space verification block shown in FIG. 6 verifies the NRZI signal, the mark/space verification block may verify that the NRZI signal represents a mark or a space whose width is equal to or smaller than the one stipulated in the standard for recording media. Assuming that the cycle of a channel clock is T, the mark or space width smaller than the one stipulated in the standard for recording medium is equal to or smaller than 2T according to the eight fourteen modulation (EFM) method for CDs or the eight sixteen (8–16) modulation method for DVDs. According to the one seven (1–7) coding that is scheduled to be adopted for optical disks on which data is recorded using a blue laser, the mark or space width is equal to or smaller than 1T. FIG. 7 shows the waveform of the NRZI signal modulated according to the 8–16 modulation (a mark of 2T wide is detected during (A) in the drawing). At this time, assuming that the phase of the clock chCLK1 is inverted 180° to be in phase with a clock chCLK2, when the clock chCLK assumes a phase angle of 180°, the phase margin ensured for strobing becomes maximum. Consequently, even when the phase relationship between the NRZI signal and clock chCLK changes due to the aforesaid factor, a strobing error will not occur. The phase inversion is performed when the conducting contacts of the switch 602 are switched in response to a detection signal 601 indicating that the mark/space verification block shown in FIG. 6 has detected the mark or space whose width is equal to or smaller than the predetermined value. Consequently, the phase of the clock CLK to be transferred to the PLL is inverted.

According to the present embodiment, the PLL that deals with the clock CLK is included. Consequently, the second embodiment provides additional benefits over the first embodiment. By including the PLL that deals with the clock CLK, the potential problem that the PLL may fail to lock on a frequency in the first embodiment is avoided. Variable-speed recording can be performed without the need to change the center frequency of the VCO 304 included in the PLL 202 along with a change in a recording speed. In addition, the second embodiment alleviates the concern of a decrease in a gain to be produced for phase comparison because the internal clock chCLK is produced from the NRZI signal in the first embodiment and the number of edges at which phases are compared with each other is smaller. Therefore, the likelihood that the frequency and phase of the internal clock chCLK will fluctuate is reduced.

Some optical disk systems perform sample-and-hold using sample timing signals 801 and 802 having the waveforms shown in FIG. 8. This is intended to achieve the objects described below.

1. Controlling laser power on a stable basis during recording.
2. Preventing saturation of an input voltage of a regeneration circuit from occurring during recording.
3. Attaining recording power high enough to improve the efficiency of a laser in emitting light during recording.

In this case, according to the present embodiment, the internal clock chCLK of the laser driver shifts 180° (=T/2, where T denotes the cycle of the clock chCLK), and the timing of sampling changes accordingly. Consequently, sampling cannot be performed at a desired timing. As shown in FIG. 5, a signal 503 (signal CLSH in FIG. 5 and FIG. 6) used to change the phase of the internal clock chCLK is transferred to each of the APC circuit 502, reading channel circuit 106, DSP 101, and microcomputer 107. Each of these circuits changes the sample-and-hold timing by T/2 in response to the signal 503. Thus, the benefit of avoiding the problem is realized.

Figure 9:
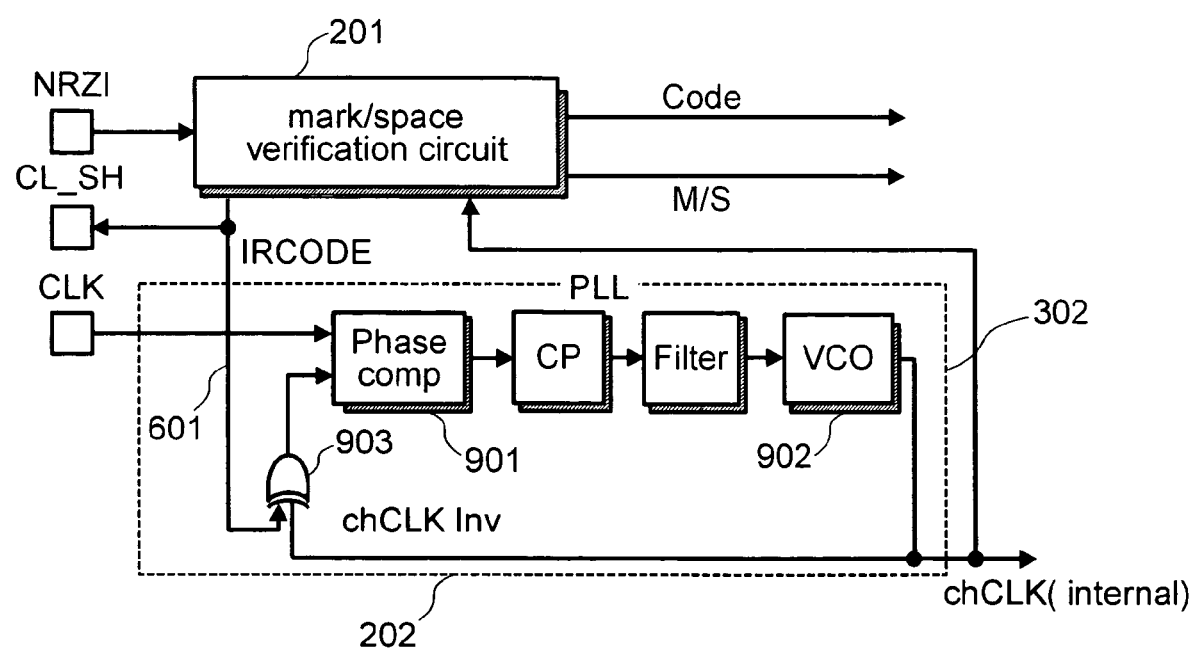
FIG. 9 shows the internal configuration of a different laser driver in accordance with the second embodiment of the present invention.

In an example of another circuitry providing the same advantages as the present invention does, as shown in FIG. 9, an exclusive OR circuit 903 is connected between a phase comparator 901 included in a PLL that produces an internal clock chCLK and a voltage-controlled oscillator (VCO) 902. One of the inputs of the exclusive OR circuit 903 is a signal IRCODE 601 shown in FIG. 6.

However, according to the present embodiment, after a mark or a space whose width is equal to or smaller than the mark or space width stipulated in the standard for recording media is verified, or in other words, after an incorrect mark or space width is detected, control is extended. Therefore, a record pulse representing the incorrect mark or space width as it is transmitted to cause a data error.

Figure 6A:
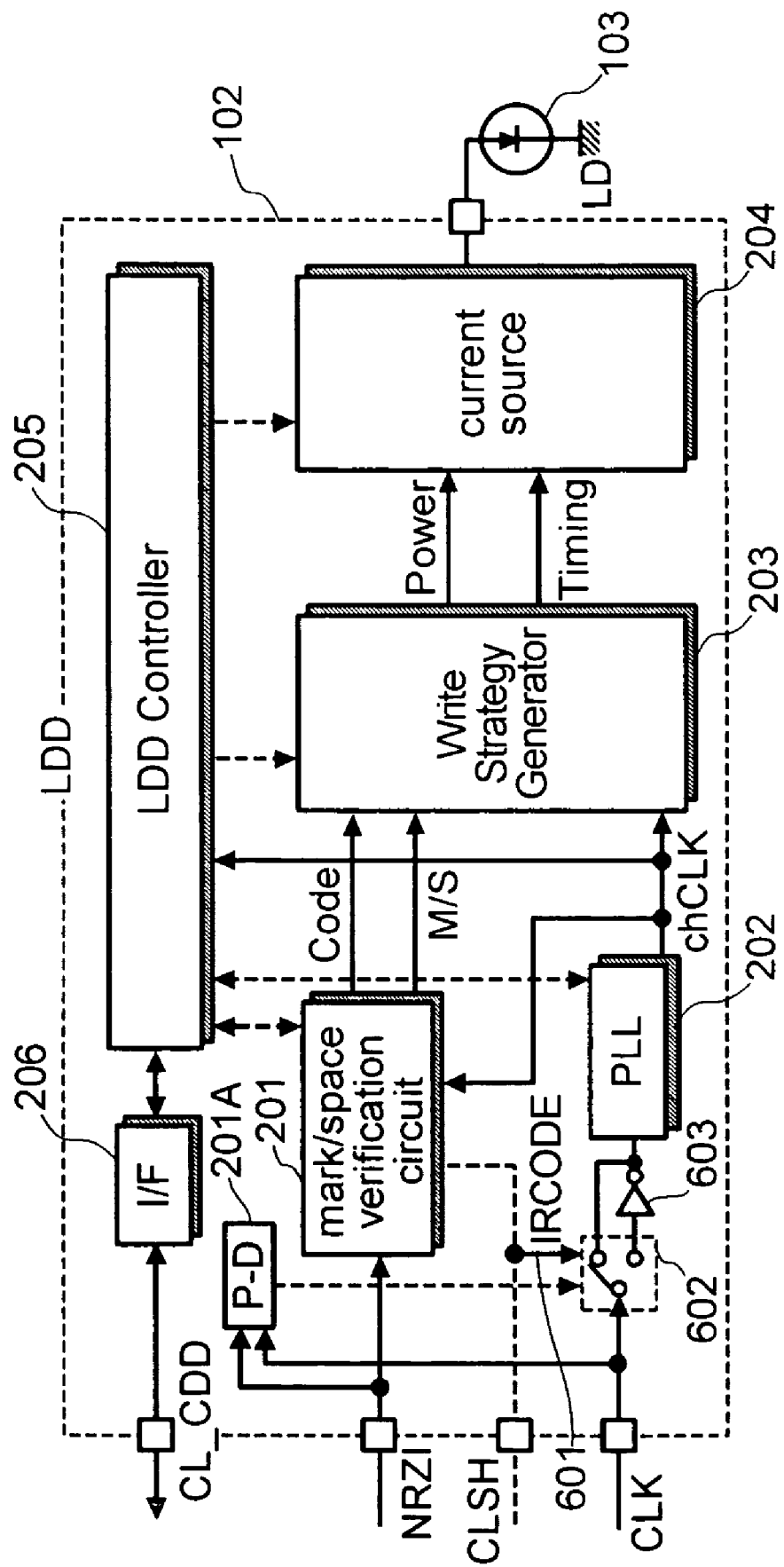
FIG. 6A shows an alternative internal configuration of the laser driver of the second embodiment.

FIG. 6A shows the an alternative internal configuration of the laser driver in which a phase difference instead of the mark/space is used to determine when to invert the phase of the recording clock. The configuration of FIG. 6A is identical to that of FIG. 6 except that a phase error detector 201A is used to detect a phase error between the NRZI or record data signal and the strobing clock used to strobe the record data signal. In this case, the strobing clock is the recording clock CLK. When the phase difference between the edge of the record data signal and the strobing edge of the strobing clock becomes equal to or smaller than a predetermined value (which typically may correspond to the predetermined length of the mark or space detected by the mark/space verification circuit 201 in the embodiment of FIG. 6), the recording clock inverter 603 inverts the recording clock.

Figure 10:
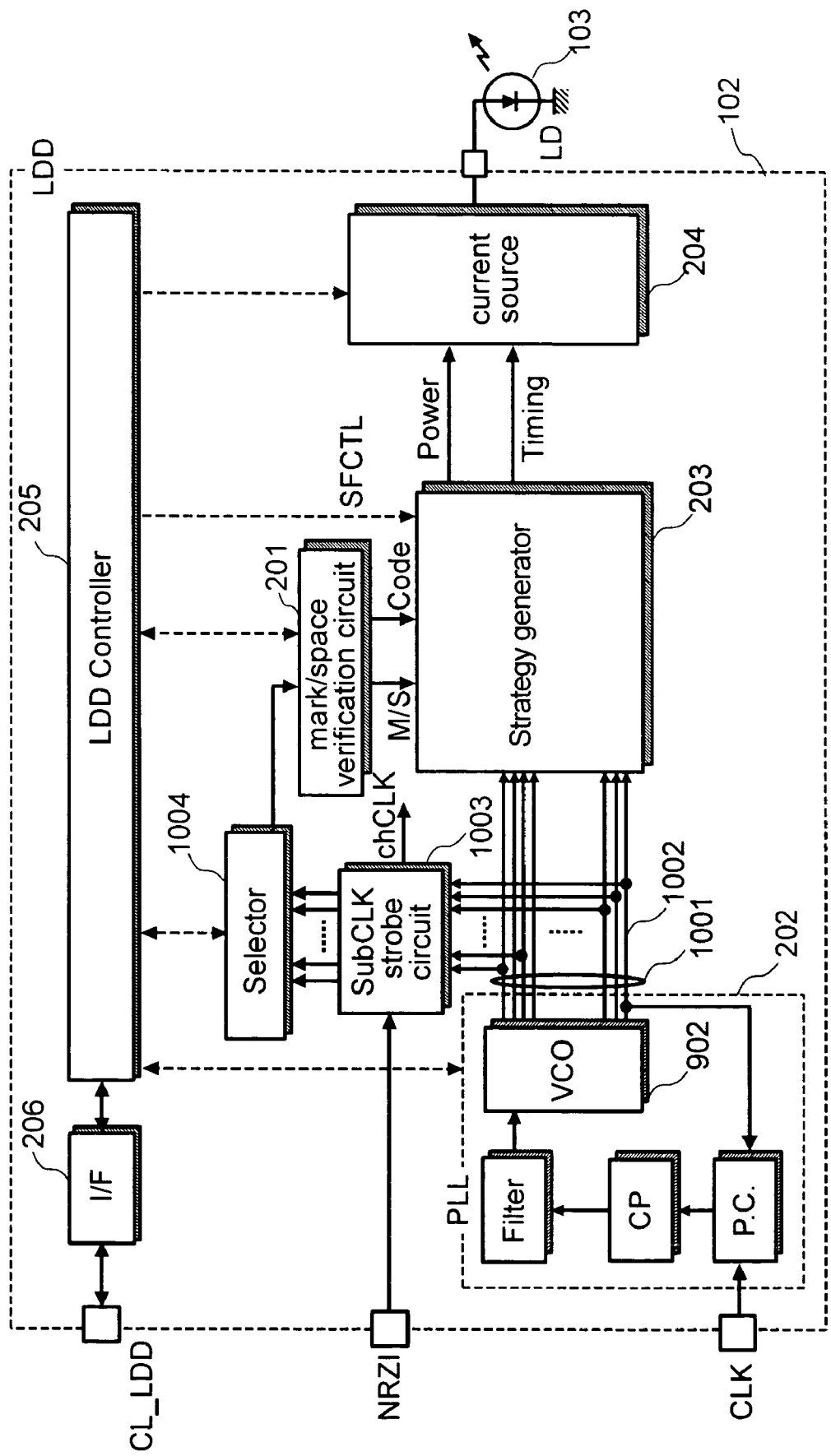
FIG. 10 shows the internal configuration of a laser driver in accordance with a third embodiment of the present invention.

FIG. 10 shows the internal configuration of a laser driver in accordance with a third embodiment of the present invention. In FIG. 10, the same reference numerals are assigned to components having the same capabilities as those shown in FIG. 6. The description of the components will be omitted. Moreover, the configuration of an optical disk system in accordance with the present embodiment is identical to the one shown in FIG. 5 except that the signal CLSH is excluded. The illustration of the configuration will therefore be omitted.

Figure 11:
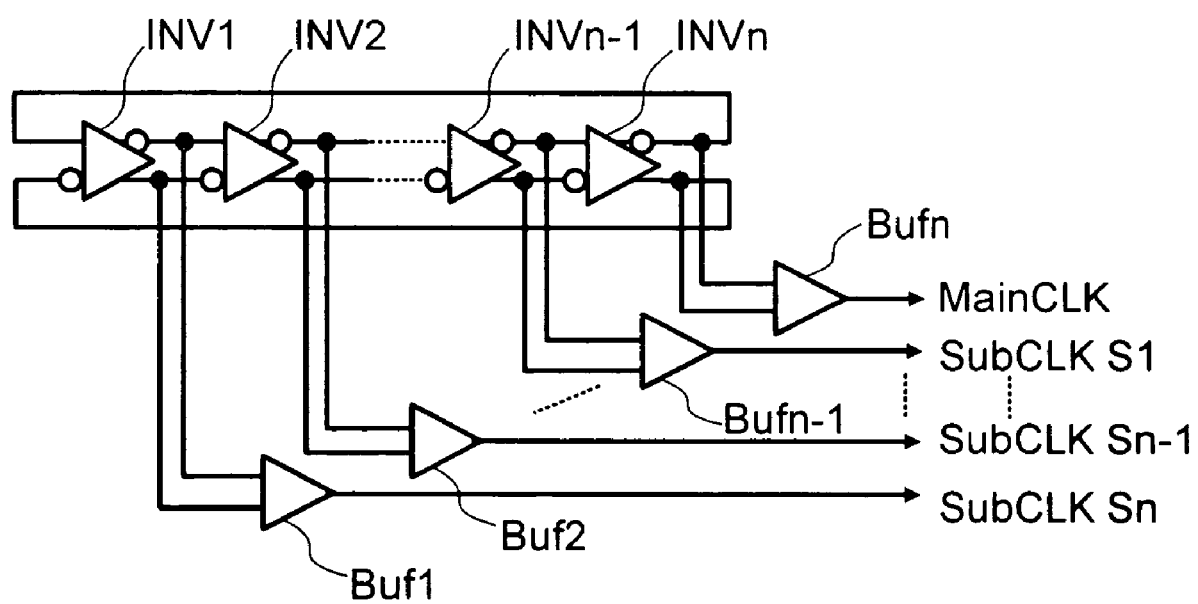
FIG. 11 shows the circuitry of a voltage-controlled oscillator included in the laser driver in accordance with the third embodiment of the present invention.

In FIG. 10, 1001 denotes a group of clocks Sub-chCLK that is used to regulate the timing of the edge of a record pulse in the next stage of a write strategy generator. Assuming that the cycle of a channel clock is Tch, n clocks Sub-CLK included in the group of clocks Sub-chCLK 1001 are out of phase with one another by Tch/n. A VCO 902 that is included in a PLL and generates the group of clocks Sub-CLK adopts the ring oscillator configuration including inverters as shown in FIG. 11. When a signal is fetched from each of the inverters, a multi-tap configuration is realized. Reference numeral 1002 denotes a clock SubCLK onto which the phase of an output signal of the PLL 202 is locked. The clock SubCLK 1002 shall be called a main clock MainCLK. Reference numeral 1003 denotes a SubCLK strobe circuit that strobes the NRZI signal according to all or one of the group of clocks SubCLK. Reference numeral 1004 denotes a strobing clock selector that selects a clock chCLK whose phase is optimal for strobing the NRZI signal on the basis of the results of strobing performed by a circuit 1102. Moreover, when the strobing clock selector 1004 selects a clock chCLK, it produces an internal NRZI signal strobed based on the selected clock chCLK at the same time. The internal NRZI signal is transferred to the mark/space verification circuit 201.

Figure 13:
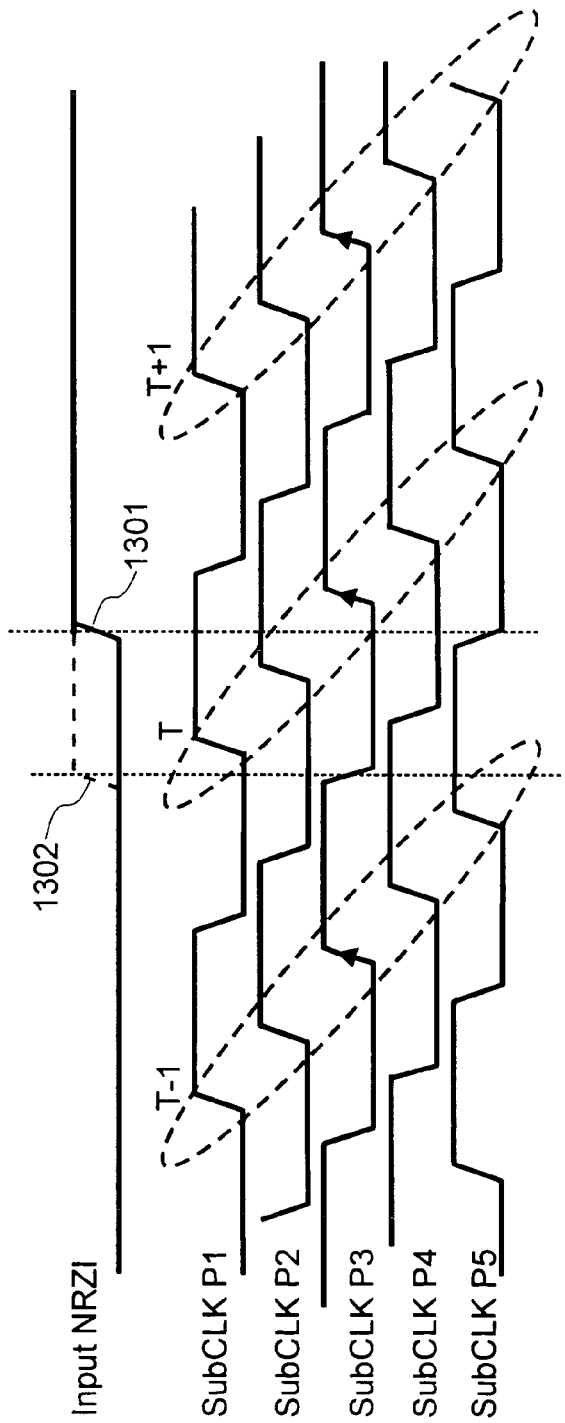
FIG. 13 shows waveforms indicating phase regulation to be performed according to the third embodiment of the present invention.

Referring to FIG. 13, a description will be made of selection of a strobing clock by the laser driver in accordance with the present embodiment. In the drawing, the subCLK strobe circuit 1003 selects five clocks SubCLK (SubCLK1 to SubCLK5), which are out of phase with one another by 72° (=360°/5), from the group of clocks Sub-CLK, and strobes the NRZI signal. As seen from Table 1, when the results of strobing the NRZI signal according to the clocks SubCLK2 and SubCLK3 respectively are different from each other, the phases of the NRZI signal relative to the clocks SubCLK are as indicated with a dot line 1301 in FIG. 13.

1. The edge of the NRZI signal comes between the edges of the clocks SubCLK that provide the different results of strobing.
2. For stable strobing, the strobing edge of a clock CLK should be set to the leading edge of a clock that comes latest after the edge of the NRZI signal. Therefore, the clock SubCLK that is 180° out of phase with the clocks SubCLK2 and SubCLK3, that is, the clock SubCLK5 should be selected.

Referring to Table 2, the results of strobing the NRZI signal according to the clocks SubCLK1 to SubCLK5 respectively are the same. The edge of the NRZI signal comes between the clocks SubCLK1 and SubCLK5, that is, is as indicated with a dashed line 1302 in FIG. 13. Consequently, the clock SubCLK3 should be selected as the clock SubCLK according to which the NRZI signal is strobed on a stable basis.

Figure 12:
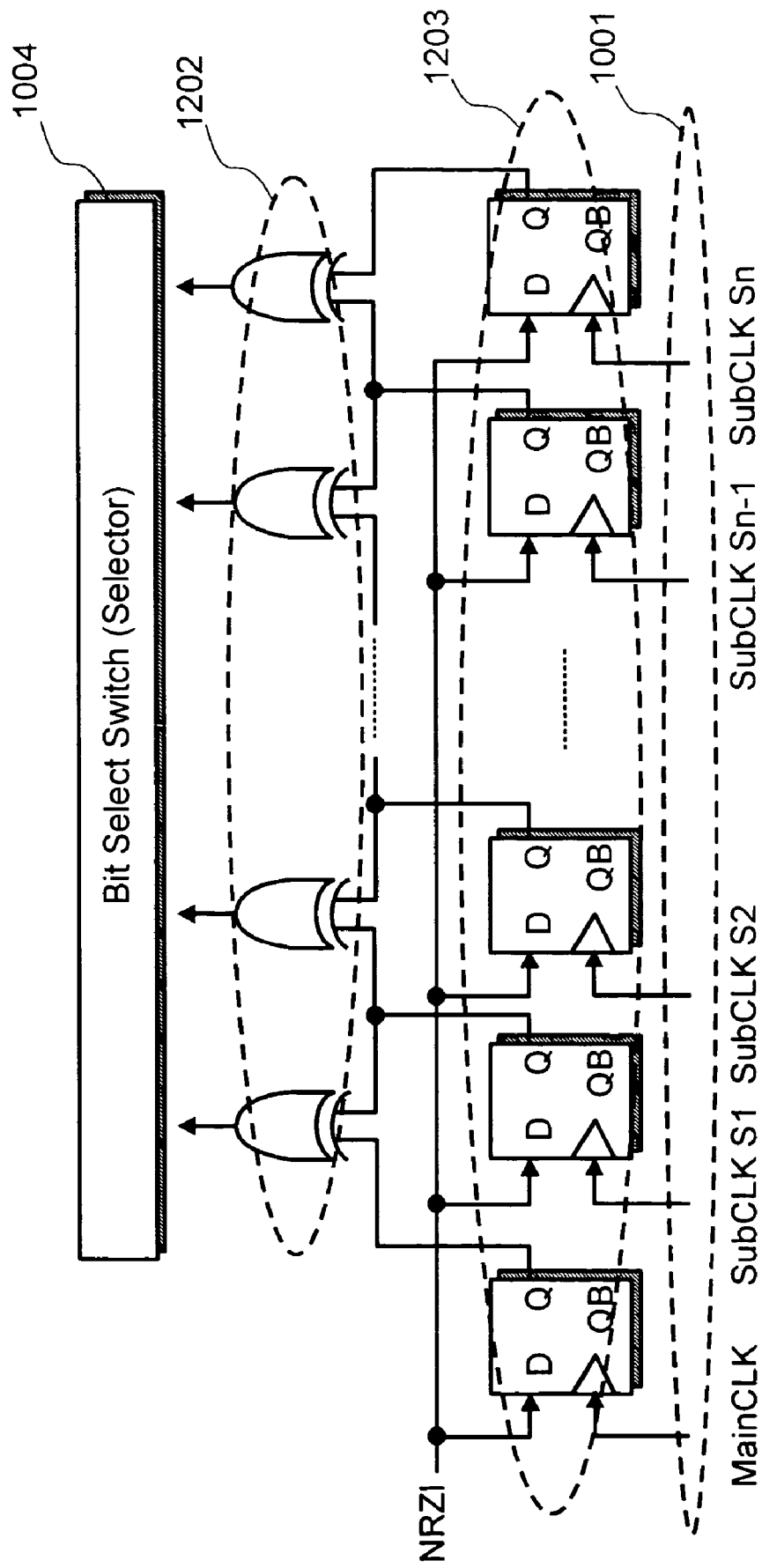
FIG. 12 shows the circuitry of a strobing clock selection block included in the third embodiment of the present invention.

FIG. 12 shows an example of the circuitry of a block (including the circuit elements 1003 and 1004 shown in FIG. 10) that selects a strobing clock. For example, flip-flops 1203 are used to strobe the NRZI signal according to the clocks SubCLK included in the group of clocks SubCLK 1001. Among the results of strobing, adjoining results are transferred to each EOR circuit 1202. An output of the EOR circuit that is bit 1 represents the different result of strobing. The switch 1004 interlocked with the output of the EOR circuit selects the clock SubCLK, which is 180° out of phase with the clocks SubCLK described in Phrase 1, as a strobing clock.

According to the constituent features of the third embodiment, it is advantageous to avoid or lower the possibility of a recording error that may occur in the second embodiment, for instance, when an incorrect mark or space width is detected and a record pulse representing the incorrect mark or space width is transmitted to cause a data error. For example, a strobing clock is dynamically selected during recording. Consequently, the NRZI signal can be strobed based on the internal clock CLK with an optimal phase relationship established between them irrespective of the phase relationship between the NRZI signal and an input clock. Thus, the third embodiment provides additional benefits.

Figure 10A:
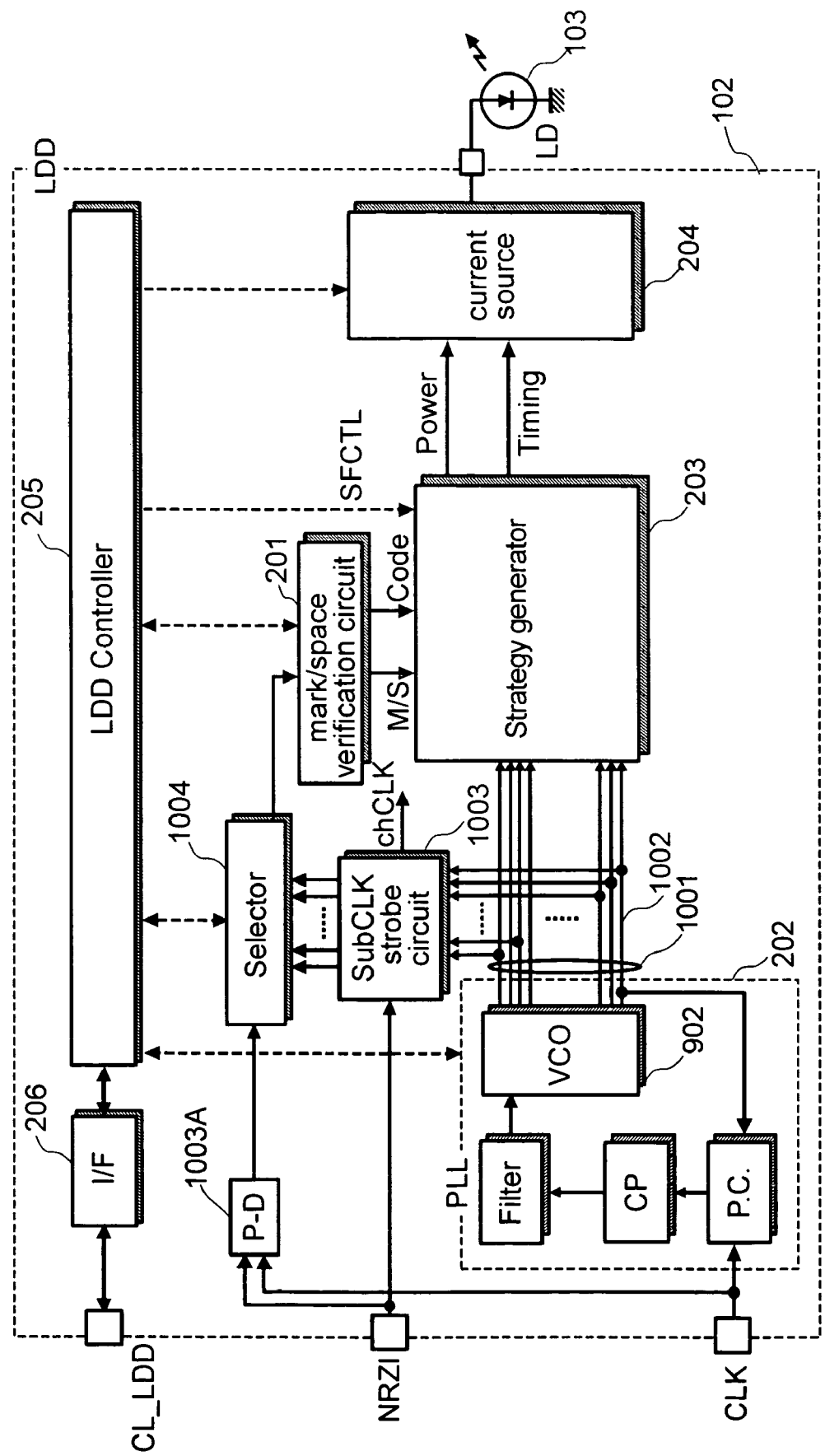
FIG. 10A shows an alternative internal configuration of the laser driver of the third embodiment.

FIG. 10A shows the an alternative internal configuration of the laser driver in which a phase error detector 1003A instead of the subCLK strobe circuit 1003 is used for clock selection. The configuration of FIG. 10A is identical to that of FIG. 10 except that the phase error detector 1003A is used to detect a phase error between the NRZI or record data signal and the strobing clock CLK used to strobe the received record data signal. Based on the result of the detection performed by the phase error detector 1003A, a strobing clock is selected from the group of clocks 1001 so that the phase difference between the edge of the record data signal and the strobing edge of the strobing clock will be maximized.

Figure 14:
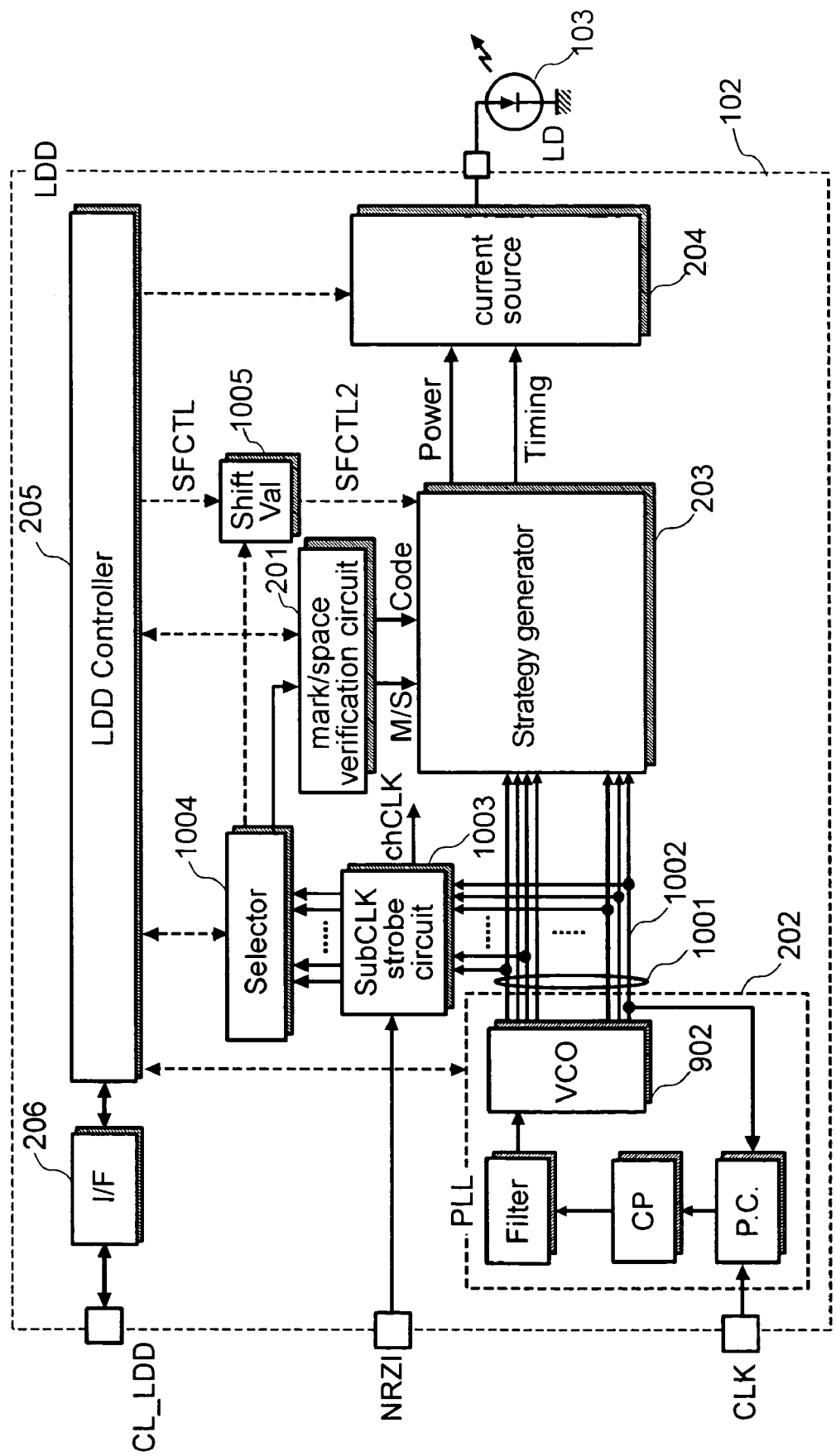
FIG. 14 shows the internal configuration of a laser driver in accordance with a fourth embodiment of the present invention.

Next, a fourth embodiment of the present invention will be described. FIG. 14 shows the internal configuration of a laser driver in accordance with the present embodiment. Referring to FIG. 14, the same reference numerals are assigned to components having the same capabilities as those shown in FIG. 10. The description of the components will be omitted. Referring to FIG. 14, reference numeral 1005 denotes a shift value adder that appends clock selection information concerning a clock selected by the clock selector 1004 to a signal SFCTL with which the controller 205 included in the laser driver directs the timing of shifting the edge of a record pulse to the write strategy generator. Owing to the shift value adder 1005, the shift of the record pulse can be regulated with reference to a selected strobing clock.

Prior to the description of actions to be performed in the present embodiment, regulating the shift of a record pulse without using the strobing clock selector 1004 will be described in conjunction with FIG. 15. The timing of the edge of a record pulse 1401 is determined with reference to a main clock 1002 used to strobe an input NRZI signal. The main clock is a clock CLK onto which an output of the PLL 202 is locked. In order to determine a setting concerning a shift of the edge of the record pulse, a group of clocks SubCLK 1403 whose phases are an n submultiple of the phase of the main clock 1402 is used. A directive value representing the setting is specified in a register included in the controller in the laser driver.

Figure 15:
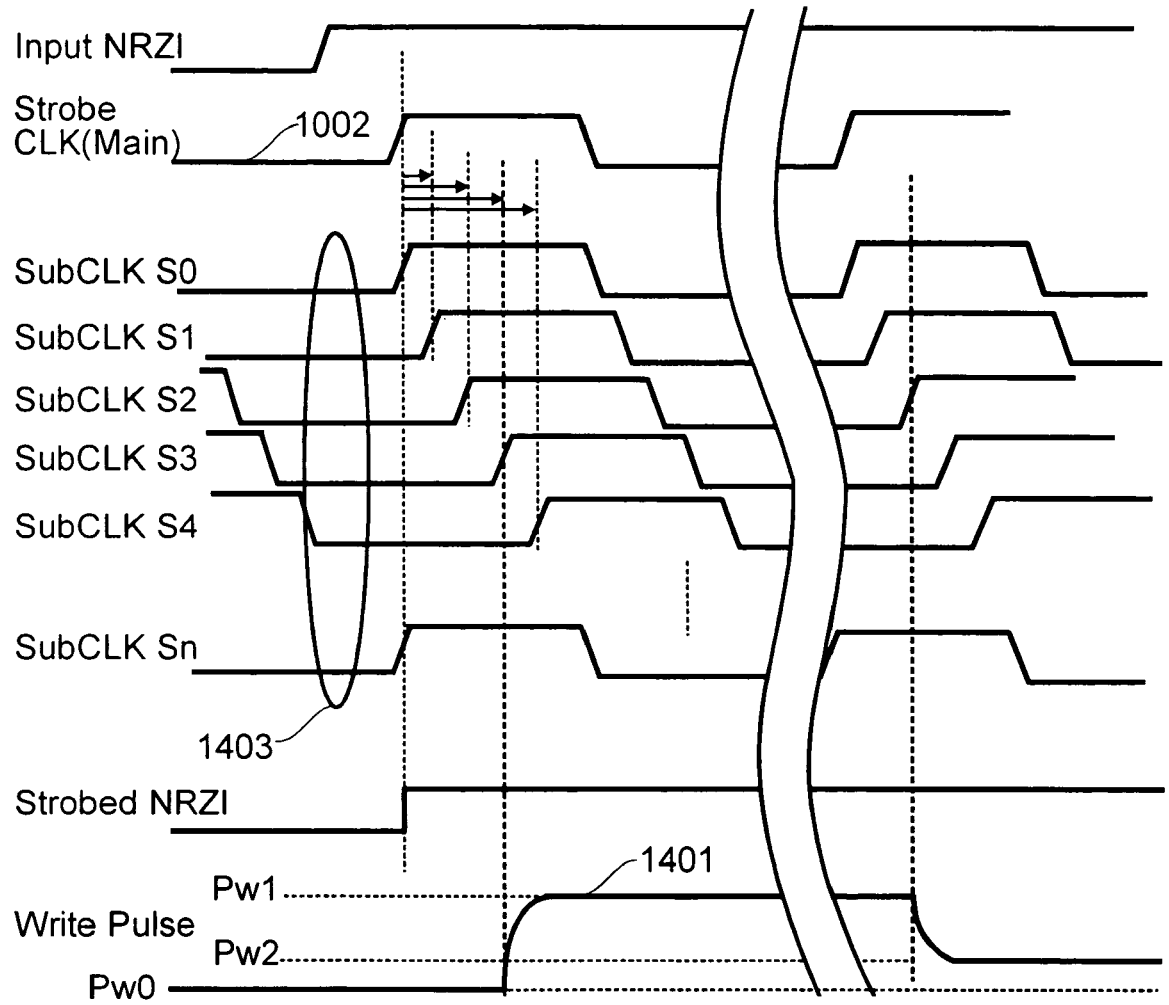
FIG. 15 shows waveforms indicating conventional regulation of a shift of an edge of a recording waveform.

Assume that the timing of the edge of the record pulse 1401 at which the power level of the record pulse 1401 changes from Pw0 to Pw1 as shown in FIG. 15 must be shifted by 3/n from the phase angle of the main clock 1002. In this case, a magnitude of a shift "3" is specified in a register (TPw1) in order to direct the timing of shifting to the power level Pw1. Likewise, when "2" is specified in a register (TPw2) in relation to the timing of changing the power level to Pw2, the timing of the edge of the record pulse at which the power level of the record pulse changes from Pw1 to Pw2 is shifted by 2/n from the phase angle of the main clock 1002. When a register is thus used to direct selection of a clock SubCLK, the timing of the edge of the record pulse can be determined arbitrarily.

Figure 16:
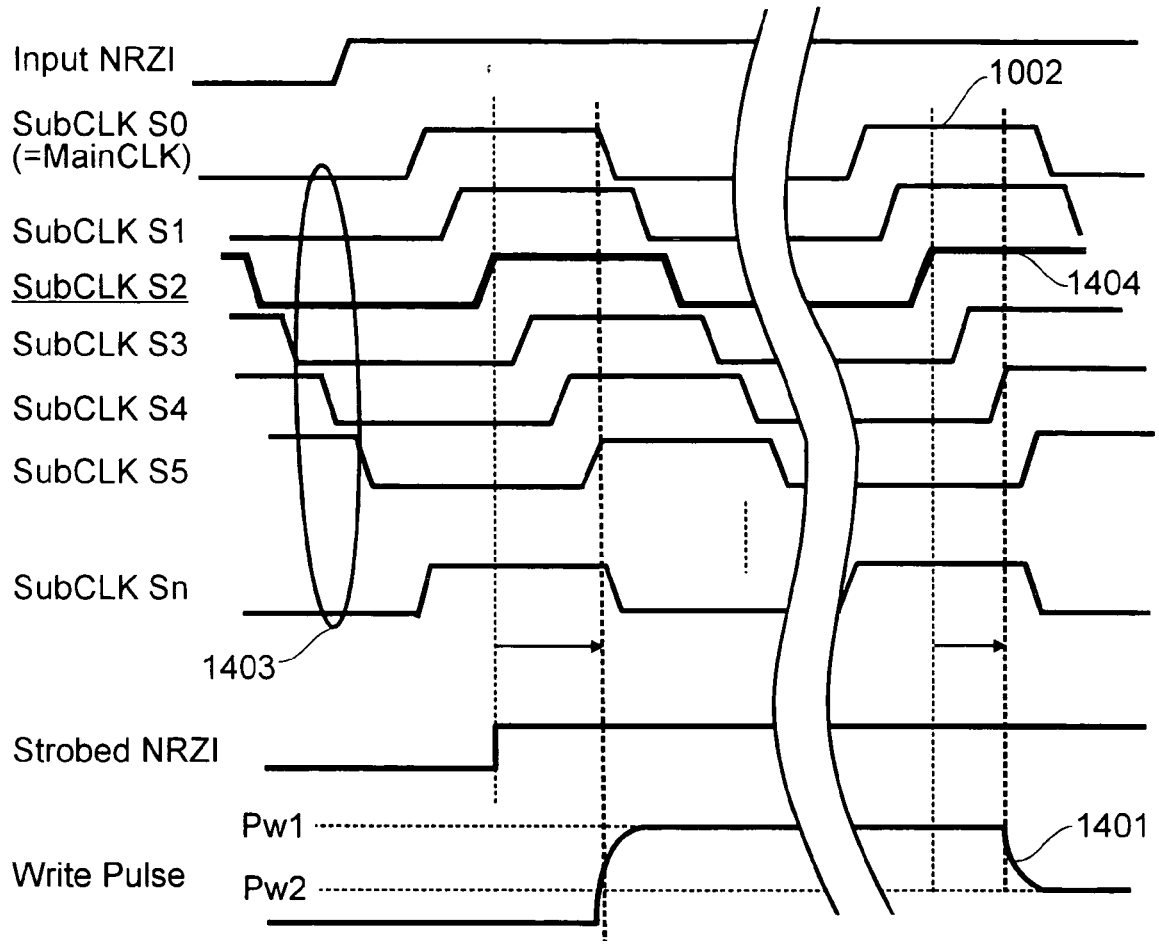
FIG. 16 shows waveforms indicating regulation of a shift of an edge of a recording waveform which is performed according to the fourth embodiment of the present invention.

Next, a method of regulating the shift of the record pulse implemented in the present embodiment will be described in conjunction with FIG. 16. A method of selecting a strobing clock implemented in the present embodiment is identical to the one implemented in the third embodiment. The description of the method will therefore be omitted. Referring to FIG. 16, the strobing clock selector 1004 selects a clock SubCLK 1404, which is shifted by 2/n relative to the main clock 1002, as the strobing clock. Assume that "3" is specified in the register (TPw1) as the magnitude of the shift of the edge of the record pulse at which the power level thereof changes into Pw1. The magnitude of the shift indicated with the register value is the magnitude of a phase shift from the edge of a strobing clock. However, the magnitude of a shift relative to the main clock must be directed to the strategy generator 203. Therefore, the shift value adder 1005 adds up the magnitude of a shift specified in the register and a phase shift of the strobing clock relative to the main clock, and transmits the result of addition as a directive value to the strategy generator. When the power level changes into Pw1 at the edge of the record pulse as shown in FIG. 16, the magnitude of a shift "3" specified in the register (TPw1) and the phase shift "2" of the strobing clock relative to the main clock are added up. The sum "5" is adopted as the magnitude of a shift of the edge of the record pulse to be directed to the strategy generator. Likewise, when the power level changes into Pw2 at the edge of the record pulse, the magnitude of a shift "2" specified in the register (TPw2) and a phase shift "2" of the strobing clock relative to the main clock are added up. The sum "4" is adopted as the magnitude of a shift of the edge of the record pulse to be directed to the strategy generator.

As mentioned above, the magnitude of a phase shift of the strobing clock, which is selected by the strobing clock selector 1004, relative to the main clock is added to the magnitude of a shift specified in relation to the edge of the record pulse. When the shift of the record pulse is controlled, the control can be achieved in the same manner as that in a case where the strobe selector 1004 is unemployed. For example, sample-and-hole described in relation to the second embodiment of the present invention is performed by utilizing the timing of the NRZI signal strobed in the laser driver. In this case, a deviation of a sampling timing caused by selection of a clock SubCLK can be avoided.

Figure 17:
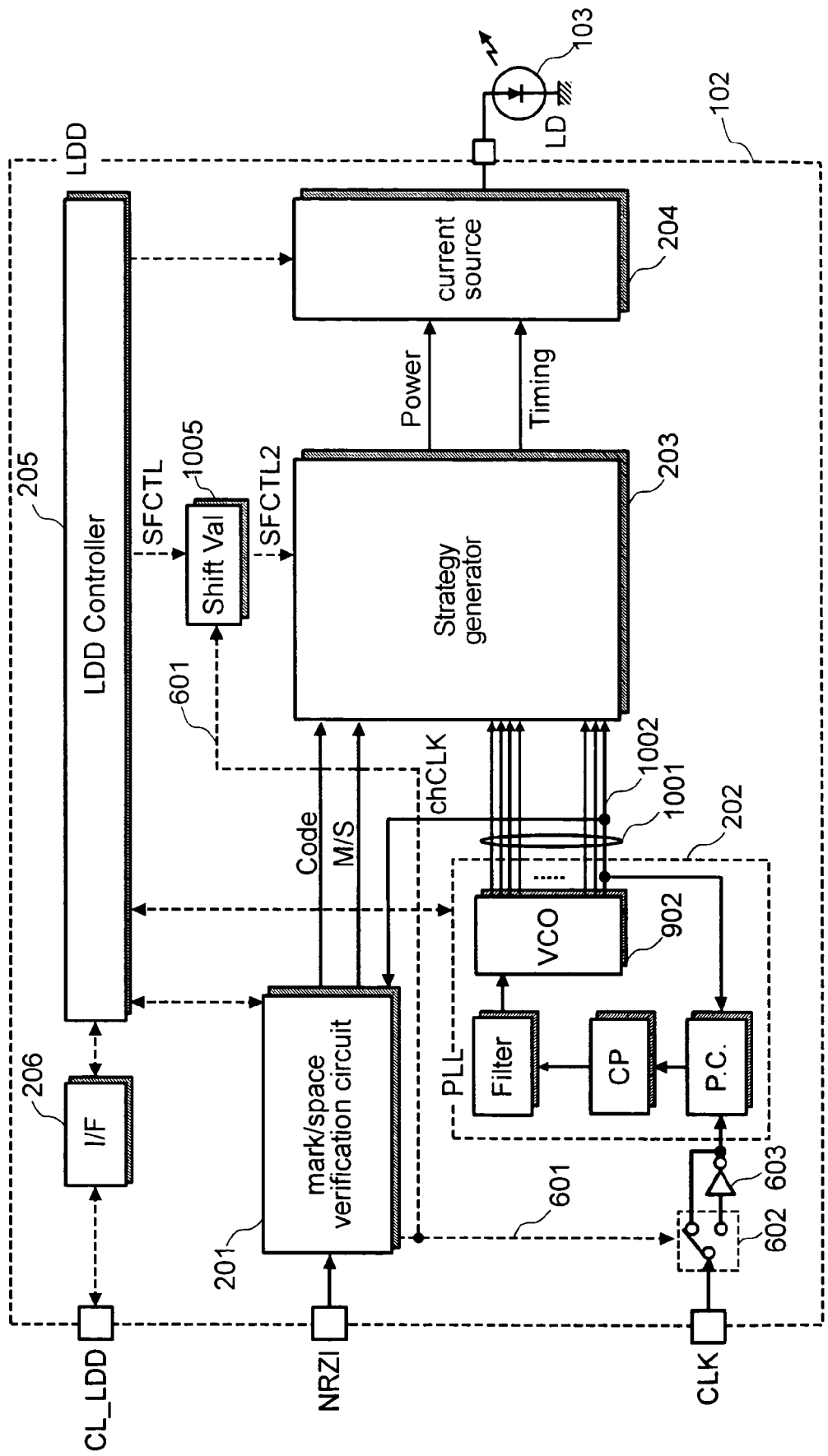
FIG. 17 shows the internal configuration of a laser driver in accordance with a fifth embodiment of the present invention.

FIG. 17 shows the configuration of a laser driver in accordance with a fifth embodiment of the present invention. In FIG. 17, the same reference numerals are assigned to components having the same capabilities as those shown in FIG. 2 and FIG. 10. The description of the components will be omitted. The configuration of an optical disk system in accordance with the present embodiment is identical to that of the optical disk system in accordance with the third embodiment. The illustration of the optical disk system will be omitted.

Actions to be performed in the present embodiment will be described below. A block that includes a mark/space verification circuit which verifies whether the width of a mark or space represented by an NRZI signal is equal to or smaller than the width stipulated in the standard for recording media, that switches the conducting contacts of a switch 602 according to the result of the verification, and that inverts 180° the phase of an input clock CLK is identical to that included in the second embodiment. Herein, the block transmits a switch selection signal 601 to the shift value adder 1005. When the phase of an internal clock chCLK is 180° inverted in response to the signal 601, the shift value adder 1005 adds or subtracts T/2 (where T denotes the cycle of the clock chCLK) to or from the magnitude of a shift by which the edge of a record pulse is shifted and which is directed to the strategy generator. Consequently, even when the phase of a clock CLK is 180° inverted in order to ensure a sufficient phase margin for strobing of the NRZI signal using the clock CLK, the timing of the edge of the record pulse can be observed. As described in relation to the fourth embodiment of the present invention, a deviation of a sampling timing caused by selection of a clock SubCLK can be prevented from occurring during sample-and-hold.

Figure 18:
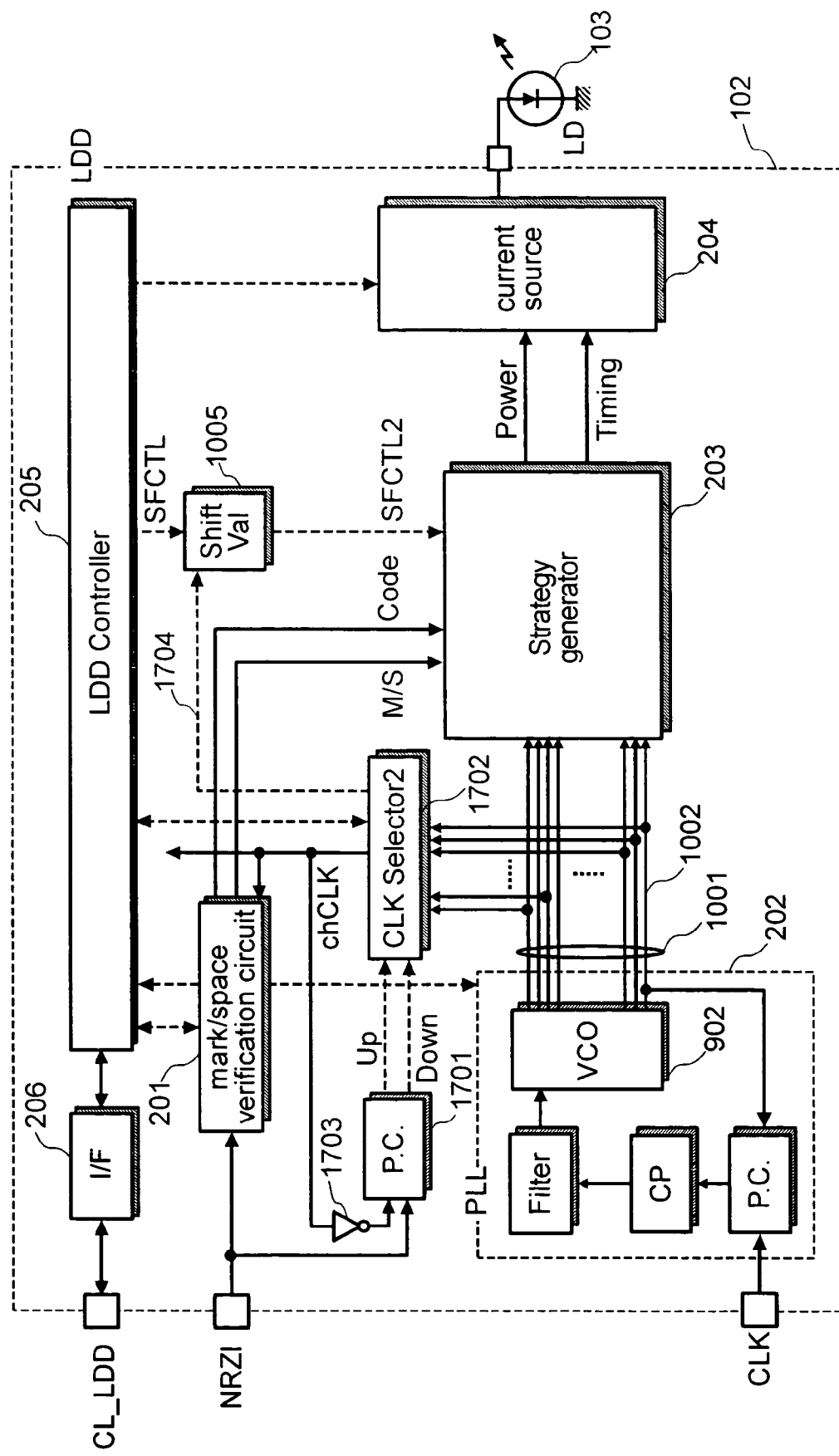
FIG. 18 shows the internal configuration of a laser driver in accordance with a sixth embodiment of the present invention.

FIG. 18 shows the configuration of a laser driver in accordance with a sixth embodiment of the present invention. In FIG. 18, the same reference numerals are assigned to components having the same capabilities as those shown in FIG. 2 and FIG. 10. The description of the components will be omitted. Moreover, the configuration of an optical disk system in accordance with the present embodiment is identical to that of the optical disk system in accordance with the third embodiment. The illustration of the configuration will be omitted.

Figure 19:
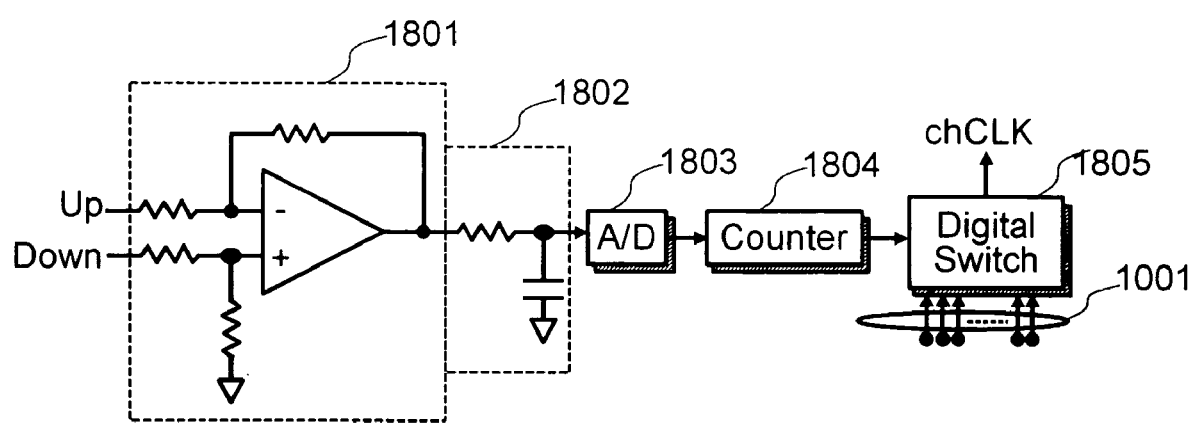
FIG. 19 shows the configuration of a clock selector included in the sixth embodiment of the present invention.
Figure 20:
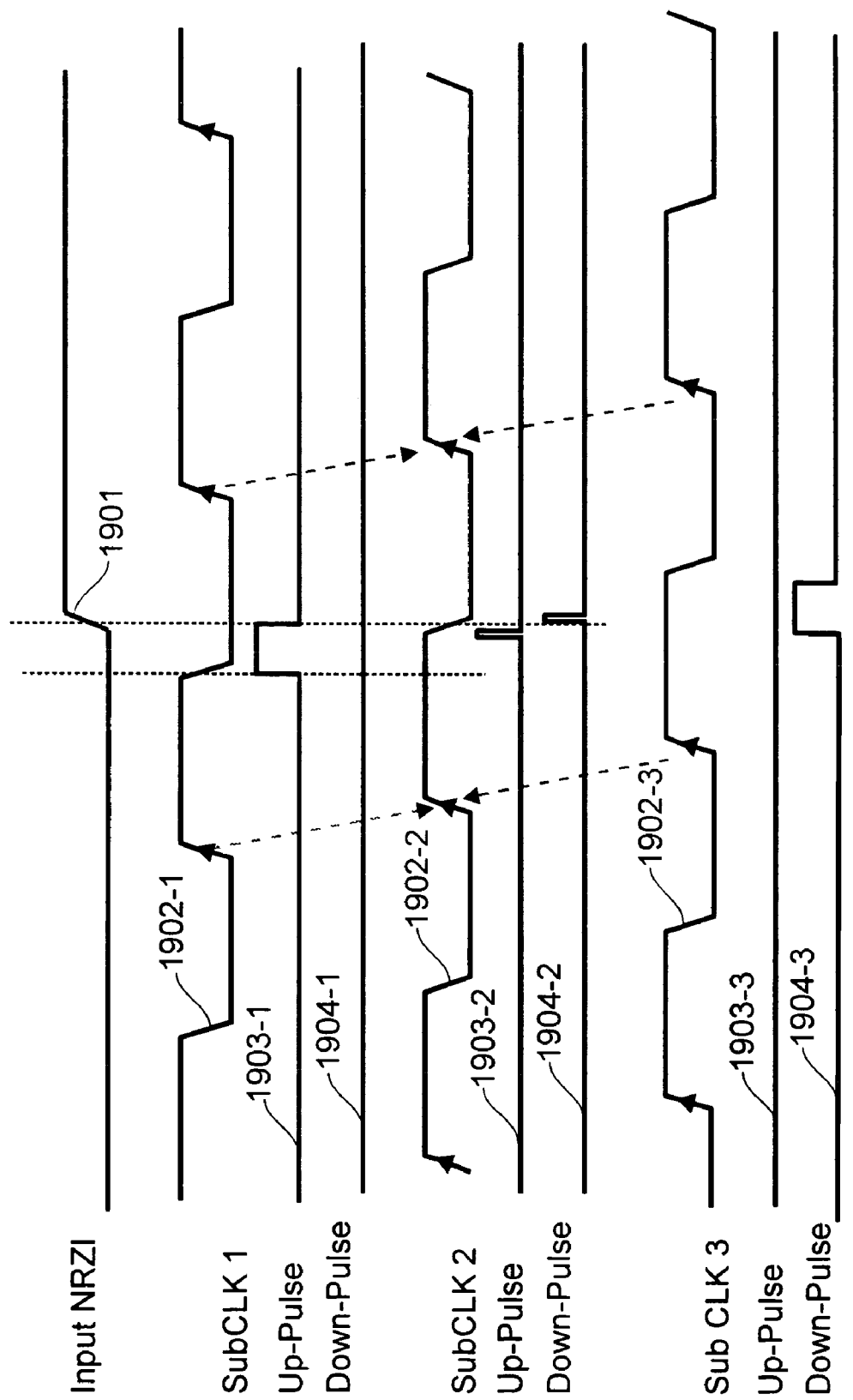
FIG. 20 shows waveforms indicating phase regulation to be performed according to the sixth embodiment of the present invention.

In FIG. 18, reference numeral 1701 denotes a phase comparator that compares the phase of an NRZI signal with the phase of an internal strobing clock selected by a clock selector 1702 that will be described later. Reference numeral 1702 denotes the clock selector that selects an internal clock chCLK, which is a strobing clock, from the group of clocks SubCLK 1001 according to an Up pulse and a Down pulse produced by the phase comparator 1701. Reference numeral 1703 denotes an inverter. FIG. 19 shows an example of a clock selector. FIG. 20 shows waveforms indicating actions to be performed in the present embodiment.

Referring to FIG. 18 to FIG. 20, actions to be performed in the present embodiment will be described below. For a received NRZI signal 1901, the clock selector 1702 shall select an internal clock chCLK 1902-1 whose phase is shown with a waveform SubCLK1 in FIG. 20. At this time, since the inverter 1703 is connected as the preceding stage of the phase comparator, the phase comparator compares the leading and trailing edges of the NRZI signal with the trailing edge of the clock ChCLK. Referring to FIG. 19, since the trailing edge of the clock chCLK 1902-1 precedes the leading edge of the NRZI signal 1901, the Up pulse 1903-1 is transmitted. At this time, the Down pulse 1904-1 is not transmitted. The Up and Down pulses are added up by an adder 1801 shown in FIG. 18 and smoothed by a low-pass filter 1802. A voltage passed through the filter 1802 is digitized by an A/D converter 1803, and counted by a counter 1804. A digital switch 1805 selects a clock CLK associated with the count value from the group of clocks SubCLK. In this case, since the Up pulse is transmitted, the output of the counter 1804 is a positive value. The setting of the digital switch 1805 is changed so that a clock SubCLK that lags behind will be selected.

On the other hand, when the clock selector 1702 selects a clock chCLK 1902-3 shown as a waveform SubCLK3 in FIG. 20, the phase comparator transmits the Down pulse 1904-3. Consequently, the output of the counter 1804 becomes a negative value. The setting of the digital switch 1805 is changed so that a clock SubCLK that leads will be selected.

Owing to the foregoing actions, the phase of the clock chCLK is converged to the phase of a waveform 1902-2 shown in FIG. 20. In this state, the pulse duration of the Up pulse 1903-2 is equal to that of the Down pulse 1904-2. The clock selector 1702 selects a clock chCLK on a stable basis. In this state, the time interval from the strobing edge, that is, the leading edge of the clock chCLK from the edge of the NRZI signal becomes maximum. The phase margin needed for strobing of the NRZI signal using the clock chCLK is maximized.

Furthermore, similarly to the fourth embodiment, the shift value adder 1005 is included so that when the clock selector 1702 selects a clock SubCLK 1704, a phase difference between the selected clock SubCLK and the main clock 1002 will be added to a set value of a shift by which the edge of a record pulse is shifted. The present embodiment can therefore provide the same advantage as the fourth embodiment can.

Figure 21:
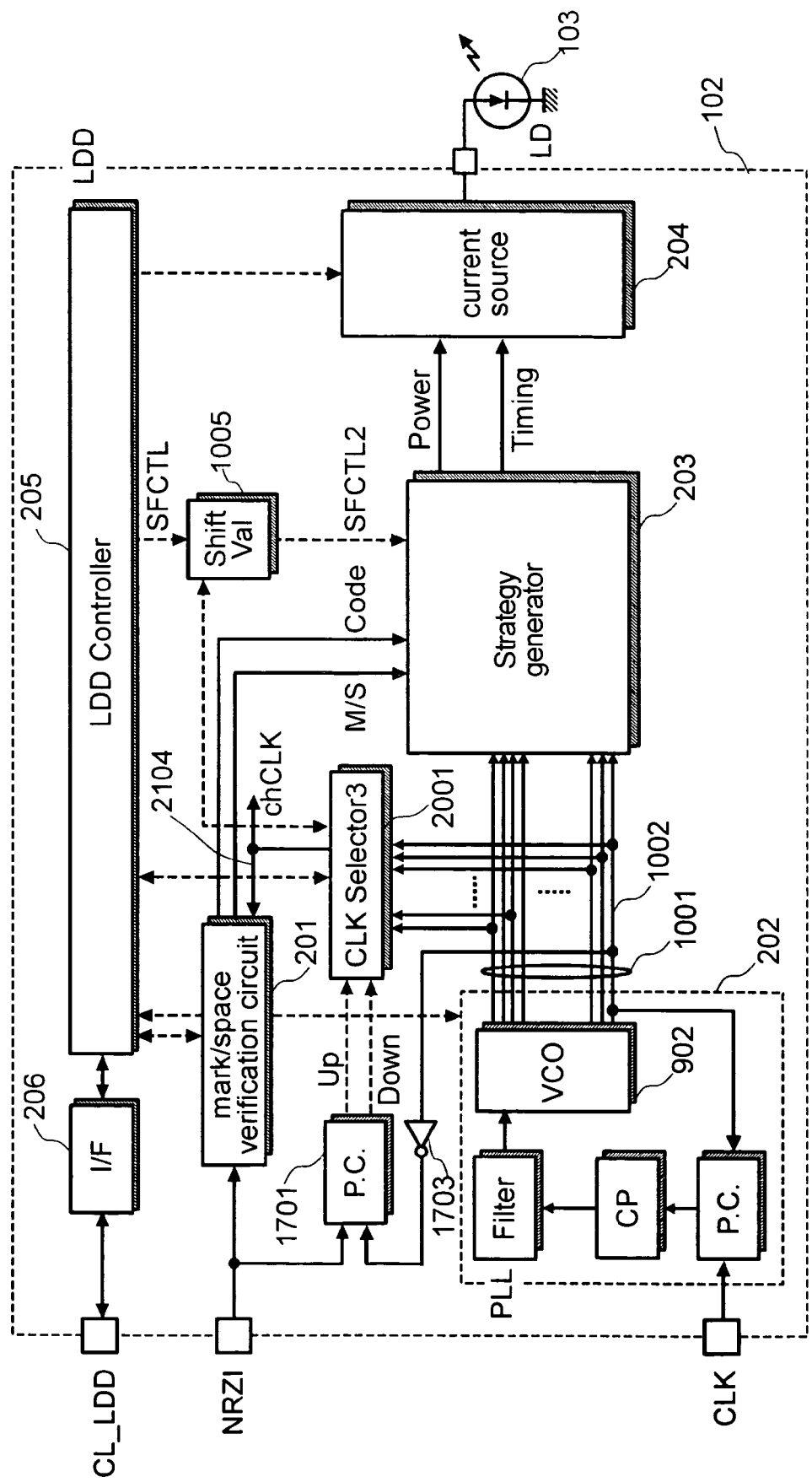
FIG. 21 shows the internal configuration of a laser driver in accordance with a seventh embodiment of the present invention.
Figure 22:
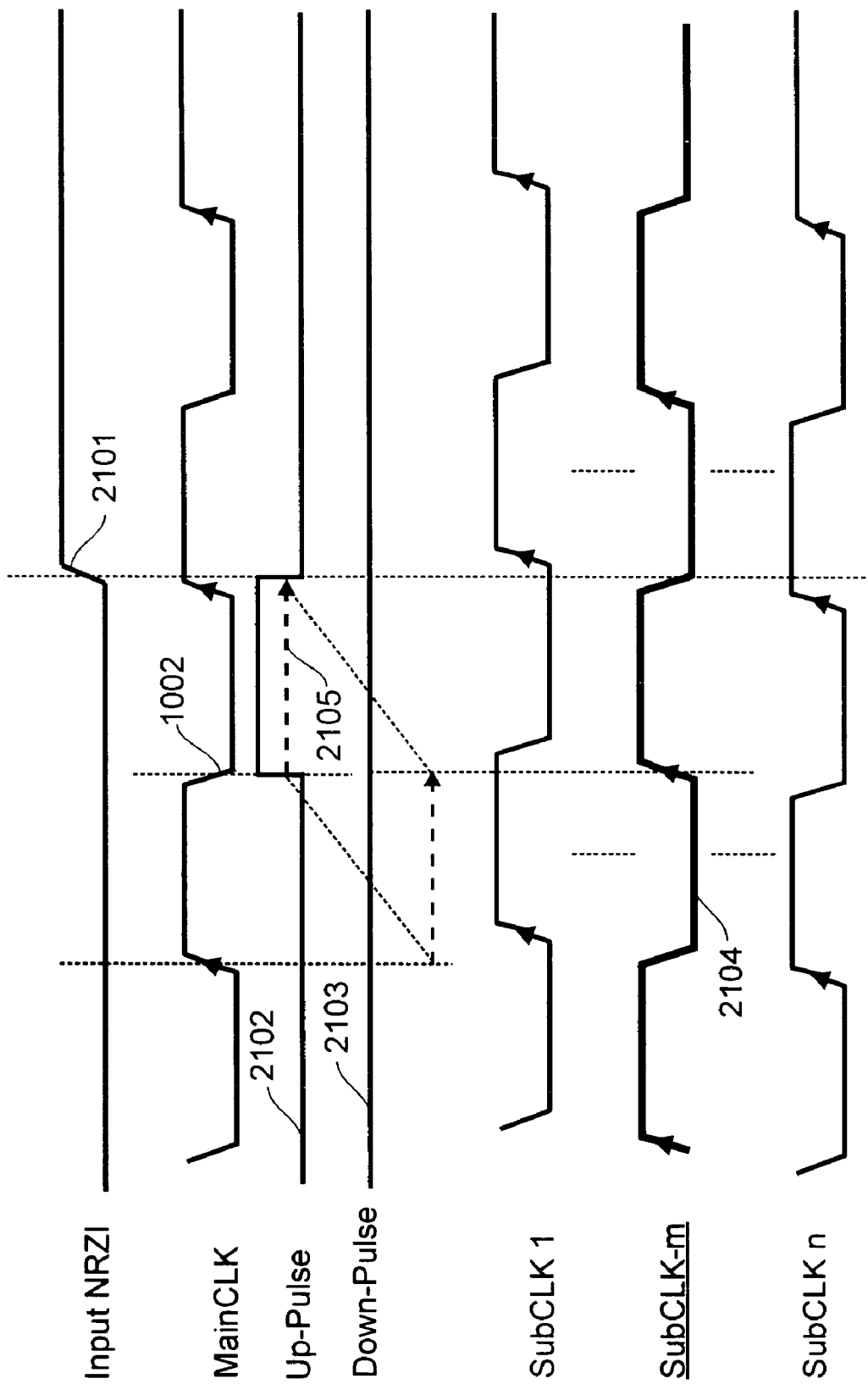
FIG. 22 shows waveforms indicating phase regulation to be performed according to the seventh embodiment of the present invention.

FIG. 21 shows the configuration of a laser driver in accordance with a seventh embodiment of the present invention. FIG. 22 shows waveforms indicating actions to be performed in the seventh embodiment. In FIG. 21, the same reference numerals are assigned to components having the same capabilities as those shown in FIG. 18. The description of the components will be omitted. Moreover, the configuration of an optical disk system in accordance with the present embodiment is identical to that of the optical disk system in accordance with the third embodiment. The illustration of the configuration will be omitted.

Differences of the configuration of the laser driver in accordance with the present embodiment from that of the laser driver in accordance with the fifth embodiment shown in FIG. 18 will be described below. According to the sixth embodiment, a clock CLK to be transferred to the phase comparator is an output of the clock selector 1702. The clock selector 1702 that selects any of clocks SubCLK is included in a feedback loop. According to the present embodiment, a clock CLK to be transferred to the phase comparator is the main clock 1002 which serves as a reference in shifting the edge of a record pulse and onto which an output of the PLL is locked. Moreover, since the fifth and sixth embodiments are different from each other in the clock to be transferred to the phase comparator, the configuration of the clock selector is different between the fifth and sixth embodiments.

Referring to FIG. 21 and FIG. 22, actions to be performed in the present embodiment will be described below. Assume that the phase of the main clock 1002 relative to a received NRZI signal 2101 is as shown in FIG. 22. At this time, the phase comparator 1701 transmits an Up pulse as indicated with a waveform 2102 in FIG. 22. On the other hand, as the duration of the pulse sent from the phase comparator is closer to zero, the phase margin needed for strobing of the NRZI signal at the leading edge of a clock CLK is larger.

Consequently, the clock selector 2001 measures the pulse duration of the Up pulse 2101 using, for example, a multiplied clock, and selects a clock SubCLK, which is shifted by a magnitude comparable to the measured pulse duration 2105, that is, a clock SubCLKm 2104 as a strobing clock chCLK. The shift value of the clock SubCLK is added to the shift value of the edge of a record pulse in the same manner as that in the sixth embodiment.

The present embodiment does not include, unlike the sixth embodiment, a feedback loop. Consideration need not be taken into the characteristic of a loop such as a delay time produced by a loop. The present embodiment has the merits that the stability in actions improves and the design is simple.

Figure 23:
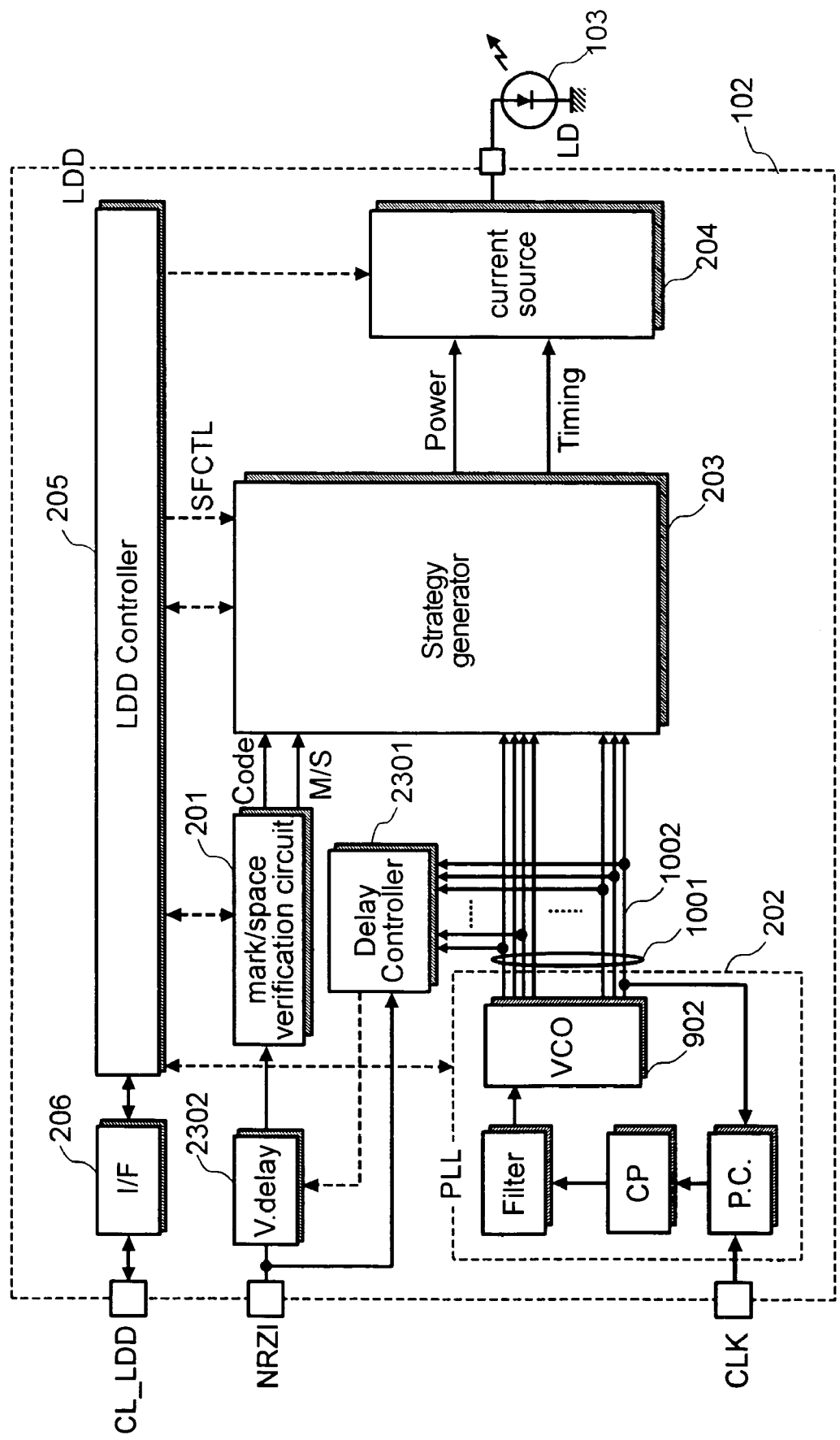
FIG. 23 shows the internal configuration of a laser driver in accordance with an eighth embodiment of the present invention.
Figure 24:
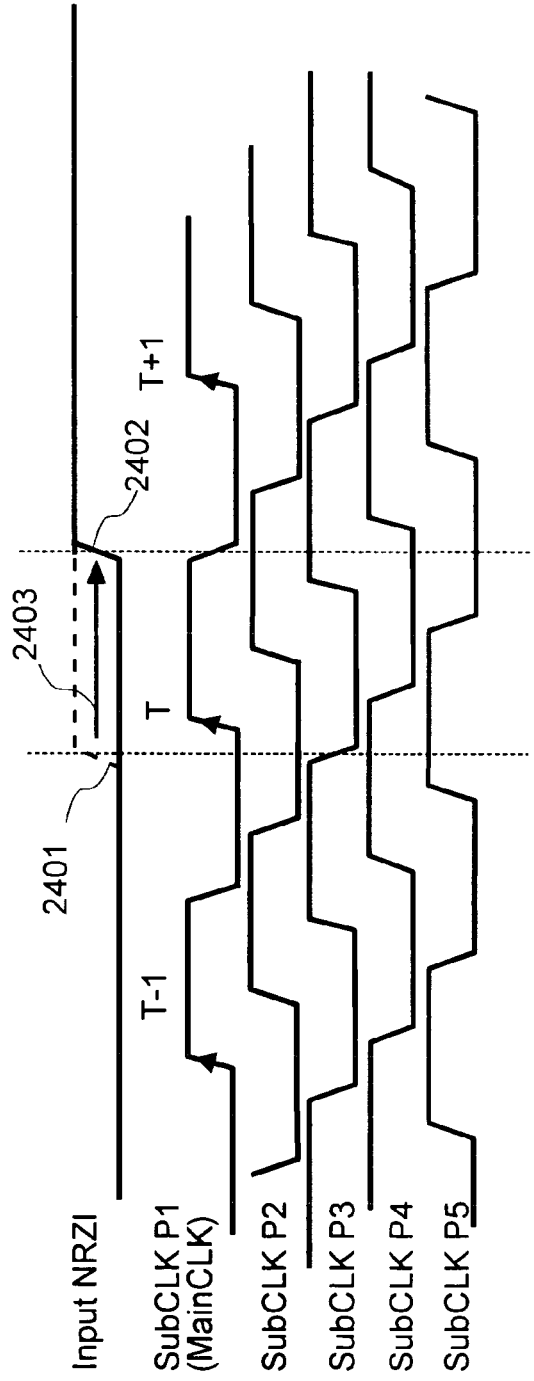
FIG. 24 shows waveforms indicating phase regulation to be performed according to the eighth embodiment of the present invention.

FIG. 23 shows the configuration of a laser driver in accordance with an eighth embodiment of the present invention. In the drawing, the same reference numerals are assigned to components having the same capabilities as those shown in FIG. 10. The description of the components will be omitted. Differences of FIG. 23 from FIG. 10 lie in a delay controller 2301 and a variable delay circuit 2302. Referring to FIG. 23 and FIG. 24 that shows waveforms indicating actions to be performed in the present embodiment, the actions to be performed in the present embodiment will be described below.

According to the present embodiment, the mark/space verification circuit strobes an NRZI signal according to a main clock 1002 shown in FIG. 23. The delay controller 2301 uses the group of clocks SubCLK 1001 to strobe the received NRZI signal. When the results of strobing are as listed in Table 3 in FIG. 24, the phase relationship of the NRZI signal relative to the main clock is as indicated with a dashed line 2401 in FIG. 24. The variable delay circuit 2302 is controlled so that it will delay the phase of the NRZI signal in a direction 2403. The delay controller 2301 varies the magnitude of a delay to be produced by the variable delay circuit 2302 until the results of strobing of the NRZI signal which is performed by the delay controller 2301 becomes as listed in Table 4 shown in FIG. 24. Consequently, the phase of the NRZI signal relative to the main clock becomes as indicated with a solid line 2402. The phase margin needed for strobing of the NRZI signal is maximized.

Incidentally, control to be extended by the variable delay circuit 2302 included in the present embodiment may be, similarly to, for example, the fifth embodiment, based on a phase difference between the NRZI signal and main clock detected by the phase comparator. Moreover, similarly to the second embodiment, a mark or space whose duration is equal to or smaller than the one stipulated in the standard for recorded media may be detected, and the magnitude of a delay to be produced by the variable delay circuit may be varied with the detection of the mark or space. According to the present embodiment, the NRZI signal is delayed. Alternatively, a received clock CLK may be delayed.

Figure 23A:
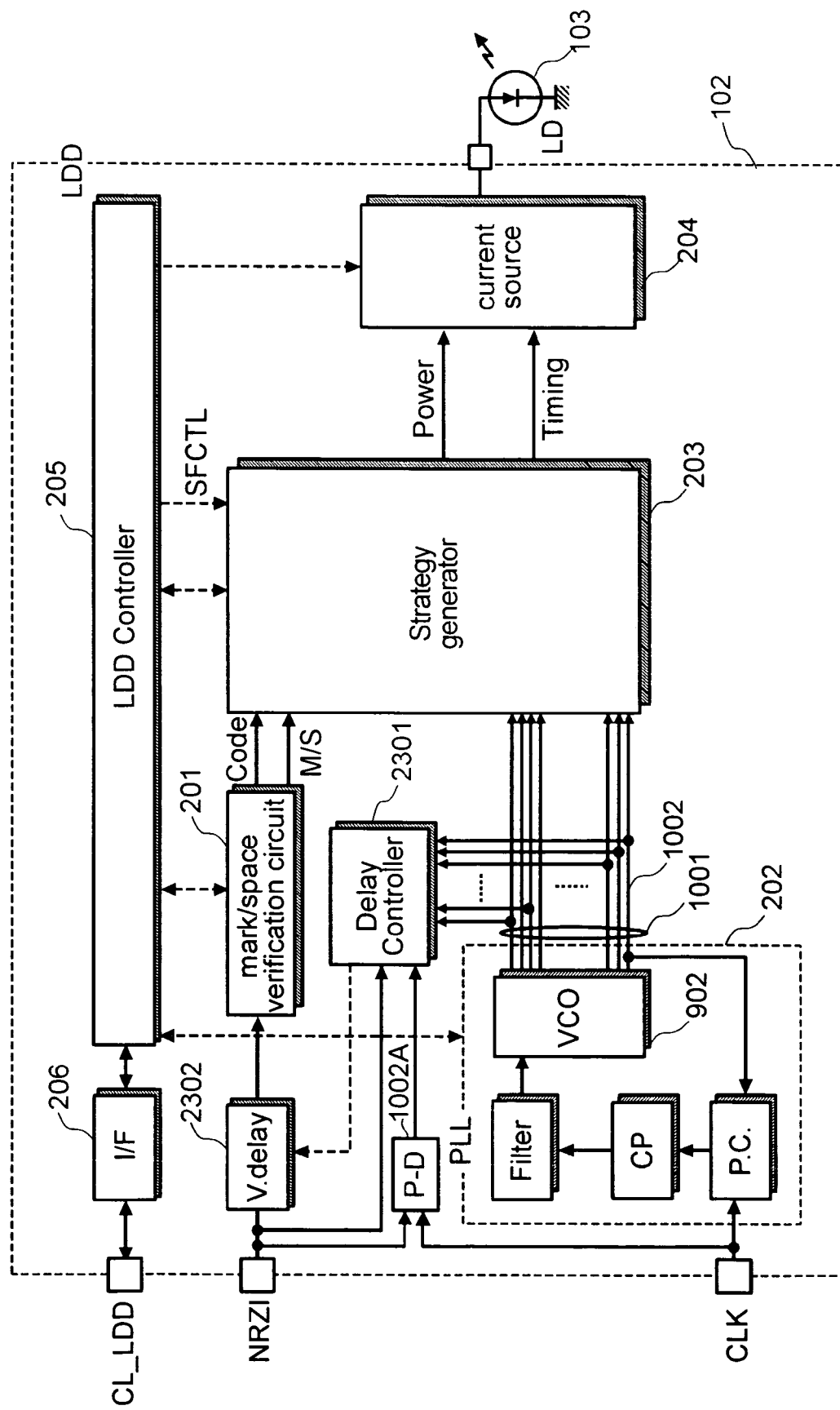
FIG. 23A shows an alternative internal configuration of the laser driver of the eighth embodiment.

FIG. 23A shows the an alternative internal configuration of the laser driver in which a phase error detector 1002A instead of the plurality of strobing clocks is used for controlling the magnitude of a delay to be produced by the variable delay circuit 2302. The configuration of FIG. 23A is identical to that of FIG. 23 except that the phase error detector 1002A is used to detect a phase error between the NRZI or record data signal and the strobing clock CLK used to strobe the record data signal. Based on the result of the phase error detector 1002A, the magnitude of a delay to be produced by the variable delay circuit 2302 is controlled so that the phase difference between the edge of the record data signal and the phase of the strobing edge of the strobing signal will be maximized.

According to embodiments of the present invention, the phase of a modulated signal, which is transmitted from a modulated signal producing device (for example, a DSP) to a laser driver included in an optical disk system during recording of a signal on a disk, relative to a recording clock can be automatically regulated. Herein, the laser driver includes a module for producing a recording waveform, that is, a write strategy from a modulated signal, which is recorded, according to a recording clock. A strobing error deriving from the imperfect establishment of the phase relationship between the recording clock and modulated signal can be minimized. Moreover, an error in recording information on a medium which is attributable to the strobing error can be minimized. Furthermore, the phase of the modulated signal relative to the recording clock can be regulated any time. A sufficient phase margin can be ensured for strobing of the modulated signal according to the recording clock.

The above-described arrangements of apparatus and methods are merely illustrative of applications of the principles of this invention and many other embodiments and modifications may be made without departing from the spirit and scope of the invention as defined in the claims. The scope of the invention should, therefore, be determined not with reference to the above description, but instead should be determined with reference to the appended claims along with their full scope of equivalents.

What is claimed is:

1. A laser driver for producing the waveform of a driving signal, which is used to drive a laser diode, according to a record data signal that represents record data to be recorded on a recording medium, and a recording clock, comprising:
   a recording clock inverter configured to invert a phase of a received recording clock; and
   a phase error detector configured to detect a phase error between a strobing clock used to strobe the record data signal and the record data signal;
   wherein when a phase difference between an edge of the record data signal and a strobing edge of the strobing clock becomes equal to or smaller than a predetermined value, said recording clock inverter inverts the recording clock.

2. A laser driver according to claim 1, wherein when the phase of the recording clock is inverted, a shift value representing the magnitude of a shift by which the timing of the edge of a record pulse is shifted equal to about a half of the cycle of the recording clock is added to or subtracted from a control value based on which the timing of the edge of the record pulse is controlled.

3. An optical disk system including the laser driver according to claim 1, further comprising a sample-and-hold circuit configured to sample and hold a waveform of a signal to be recorded on a recording medium or a waveform of a signal to be regenerated from a recording medium; and wherein a control signal, based on which a phase of a recording clock or a strobing clock is changed by substantially 180°, is used to substantially cause a 180° change to the sampling timing at which said sample-and-hold circuit samples a waveform.

4. A laser driver for producing the waveform of a driving signal, which is used to drive a laser diode, according to a record data signal that represents record data to be recorded on a recording medium, and a recording clock, comprising:
   a variable delay circuit configured to vary a phase of the record data signal or the recording clock; and
   a mark/space verification circuit configured to verify, according to the recording clock, whether the record data represented by the record data signal is a mark or space;
   wherein when said mark/space verification circuit detects a mark or space whose length is equal to or smaller than a predetermined length, a delay to the phase of the record data signal or the recording clock to be produced by said variable delay circuit is varied.

5. A laser driver according to claim 4, further comprising a delay controller configured to use a group of clocks to strobe the record data signal; wherein said mark/space verification circuit is configured to use an internal clock synchronous with the recording clock to strobe the record data signal; and wherein said delay controller is configured to vary the magnitude of the delay to be produced by the variable delay circuit based on results of strobing the group of clocks, the group of clocks including a plurality of clocks that are out of phase with the internal clock by predetermined magnitudes.

6. A laser driver for producing the waveform of a driving signal, which is used to drive a laser diode, according to a record data signal that represents record data to be recorded on a recording medium, and a recording clock, comprising:

a phase-locked loop configured to produce an internal clock synchronous with the recording clock and a group of clocks including a plurality of clocks that are out of phase with the internal clock by predetermined magnitudes;

a write strategy controller configured to control a timing of an edge of a write strategy by utilizing the timings of the edges of the group of clocks; and a selector configured to select a strobing clock, which is used to strobe a received record data signal, from the group of clocks;

wherein said selector is configured to select a strobing clock, which is used to produce a write strategy comprising a recording waveform from clocks, which are used for strobing, according to results of strobing the record data signal using the clocks included in the group of clocks so as to maximize a phase difference between the edge of the record data signal and the strobing edge of the strobing clock.

7. A laser driver according to claim 6, wherein when a strobing clock is selected from the group of clocks, the phase of a reference clock serving as a reference of a control value based on which the timing of the edge of a record pulse is controlled is agreed with the phase of the strobing clock.

8. An optical disk system including the laser driver according to claim 6, further comprising a sample-and-hold circuit configured to sample and hold a waveform of a signal to be recorded on a recording medium or a waveform of a signal to be regenerated from a recording medium; and wherein when clocks from which a strobing clock is to be selected are changed, the sample-and-hold timing is changed so that the timing of sampling the waveform of a signal to be recorded on a recording medium included in said optical disk system or the waveform of a signal to be regenerated from the recording medium during sample-and-hold will agree with the timing of the edge of the strobing clock.

* * * * *